(12) United States Patent
Goh et al.

(10) Patent No.: US 11,596,859 B2
(45) Date of Patent: Mar. 7, 2023

(54) SYSTEM AND METHOD FOR KEYBOARD AND PALM REST THREE-DIMENSIONAL HAPTIC EXPERIENCE

(71) Applicant: Dell Products, LP, Round Rock, TX (US)

(72) Inventors: Peng Lip Goh, Singapore (SG); Deeder M. Aurongzeb, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 17/112,826

(22) Filed: Dec. 4, 2020

(65) Prior Publication Data

US 2022/0176241 A1   Jun. 9, 2022

(51) Int. Cl.
| A63F 13/285 | (2014.01) |
| A63F 13/90 | (2014.01) |
| A63F 13/837 | (2014.01) |
| H03K 17/96 | (2006.01) |
| G06N 3/084 | (2023.01) |

(52) U.S. Cl.
CPC .......... *A63F 13/285* (2014.09); *A63F 13/837* (2014.09); *A63F 13/90* (2014.09); *G06N 3/084* (2013.01); *H03K 17/9643* (2013.01); *A63F 2300/1037* (2013.01); *A63F 2300/5553* (2013.01); *A63F 2300/8082* (2013.01); *H03K 2217/96015* (2013.01)

(58) Field of Classification Search
CPC .................... A63F 13/285; A63F 13/90; A63F 2300/1037; A63F 2300/5553
See application file for complete search history.

(56) References Cited

U.S. PATENT DOCUMENTS

| 7,127,087 | B2 | 10/2006 | Huang |
| 7,548,232 | B2 | 6/2009 | Shahoian |
| 8,390,594 | B2 | 3/2013 | Modarres |
| 8,466,859 | B1 | 6/2013 | Herz |
| 9,448,631 | B2 | 9/2016 | Winter |
| 9,636,574 | B2 | 5/2017 | Casparian |
| 10,984,637 | B2 * | 4/2021 | Albright .................. G08B 6/00 |

(Continued)

*Primary Examiner* — Thomas J Hong
*Assistant Examiner* — Carl V Larsen
(74) *Attorney, Agent, or Firm* — Prol Intellectual Property Law, PLLC; H. Kenneth Prol

(57) ABSTRACT

A three-dimensional (3D) haptic keyboard and palm rest experience system for an information handling system may comprise a display device displaying an avatar image located within a virtual 3D gaming environment generated by a gaming application, a processor determining an action involving the avatar image is being displayed, and a position of the action within the virtual 3D gaming environment, a keyboard controller identifying a haptic region of a keyboard and palm rest assembly having a location with respect to the user that correlates to the position of the action within the virtual 3D gaming environment, and the keyboard controller applying a change in voltage, via a printed circuit board assembly, across a piezoelectric actuator disposed beneath the haptic region to cause haptic movement in the haptic region correlated to the position of the action displayed within the virtual 3D gaming environment.

20 Claims, 10 Drawing Sheets

(56) References Cited

U.S. PATENT DOCUMENTS

| | | | | |
|---|---|---|---|---|
| 2002/0033795 A1* | 3/2002 | Shahoian | ............... | G06F 1/169 |
| | | | | 345/156 |
| 2004/0093363 A1* | 5/2004 | Cargin, Jr. | .......... | G06F 15/0283 |
| | | | | 708/131 |
| 2013/0038603 A1* | 2/2013 | Bae | ........................ | G06F 3/016 |
| | | | | 345/419 |
| 2015/0227207 A1* | 8/2015 | Winter | .................... | G06F 3/016 |
| | | | | 345/174 |
| 2016/0070348 A1* | 3/2016 | Cowley | .................. | G06F 3/016 |
| | | | | 345/156 |
| 2016/0202760 A1* | 7/2016 | Churikov | .............. | A63F 13/285 |
| | | | | 345/173 |
| 2017/0177072 A1* | 6/2017 | Akcadag | .................. | G06F 3/01 |
| 2017/0232338 A1* | 8/2017 | Goslin | ................. | A63F 13/327 |
| | | | | 463/31 |
| 2017/0266558 A1* | 9/2017 | Rath | ........................ | G06F 8/38 |
| 2017/0333788 A1* | 11/2017 | Grant | ...................... | G06F 3/016 |
| 2019/0208662 A1* | 7/2019 | Lee | ....................... | G06F 1/1624 |
| 2021/0027120 A1* | 1/2021 | Power | ...................... | G06T 1/60 |
| 2021/0031235 A1* | 2/2021 | Neuwirth | ............. | G06F 3/0202 |

\* cited by examiner

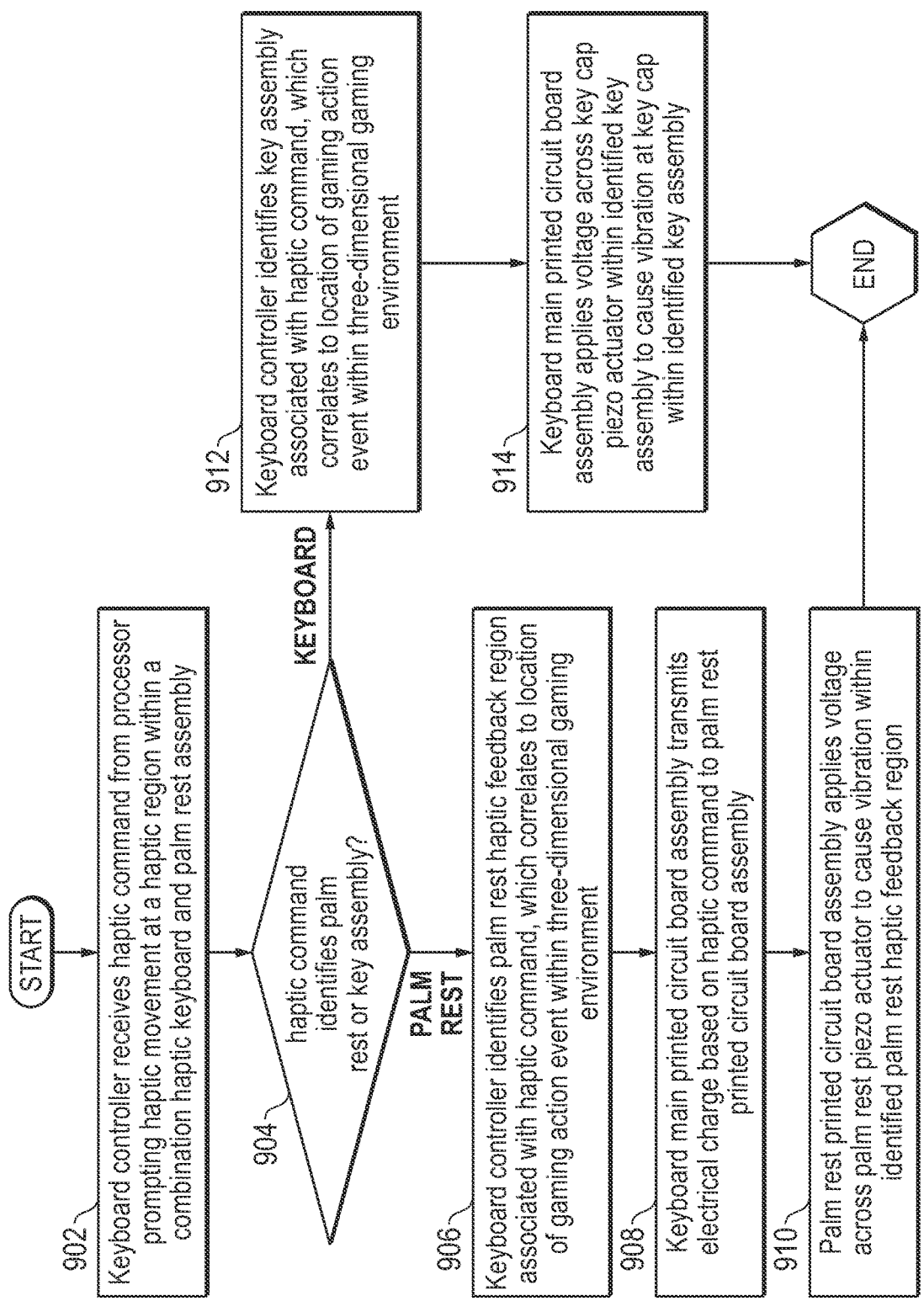

SYSTEM AND METHOD FOR KEYBOARD AND PALM REST THREE-DIMENSIONAL HAPTIC EXPERIENCE

FIELD OF THE DISCLOSURE

The present disclosure generally relates to a combined keyboard and palm rest assembly of, for example, an information handling system. The present disclosure more specifically relates to generation of haptic movement feedback at one or more piezoelectric actuators of a combination haptic keyboard and palm rest assembly to enhance gameplay experience.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard or other input or output devices such as cursor control devices for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 9 is a flow diagram illustrating a method of generating haptic movement at a portion of a combination keyboard and palm rest assembly according to an embodiment of the present disclosure.

The use of the same reference symbols in different drawings may indicate similar or identical items.

DETAILED DESCRIPTION OF THE DRAWINGS

Figure 1:
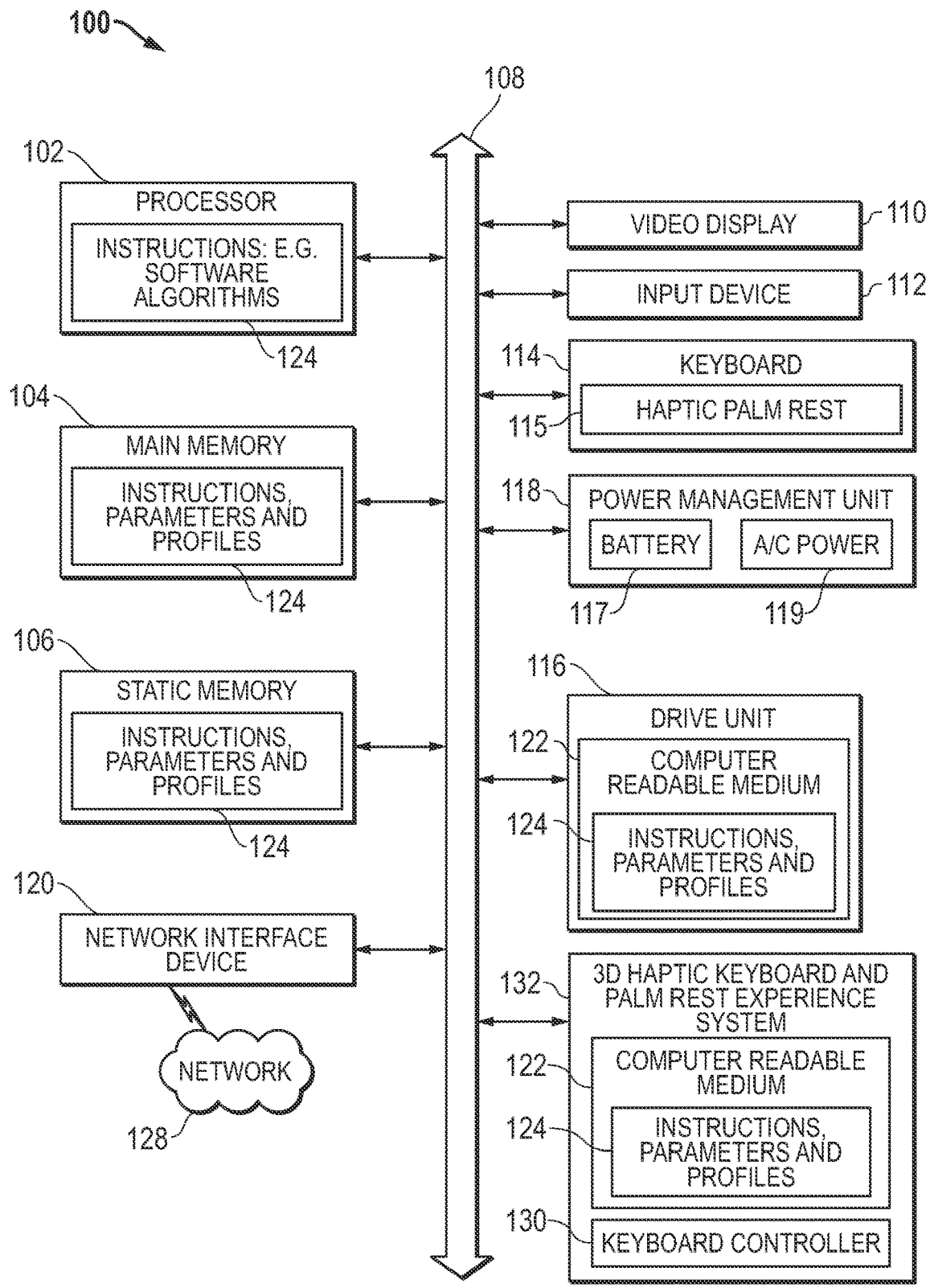
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Interest in immersive gaming experiences drives the computer gaming industry. Such immersive gaming experiences operate to provide the user with multi-sensory perception of actions occurring during live gameplay in which the user is participating. Early development of computer gaming involved low-level graphics and monophonic sound, such as that experienced while playing kiosk-type video games in arcades. The video and computer game industry has evolved over several decades to incorporate ever-improving visual graphics, surround-sound, high-definition sound, and in some cases, haptic movement such as vibrations. Early efforts at delivering such haptic movement included gaming console hand controllers that vibrate under certain conditions during live gameplay. For example, the Sony® PlayStation® or Microsoft® Xbox® controllers provided a vibrational pulse when an avatar representing the player inputting instructions via the controller incurred damage or was injured during live gameplay.

As computer-based gaming involving user input via a keyboard and mouse has increased in popularity, a need has arisen for the incorporation of such haptic movement into one or more portions of such a keyboard or mouse. The greater surface area of a keyboard in comparison to that of haptic game console controllers (e.g., Play Station or Xbox) presents an opportunity for haptic movement at the keyboard to represent not only an event occurring within gameplay (e.g., player avatar incurring damage), but the location of such an event within the virtual three-dimensional gaming environment in which the player's avatar (or a portion thereof, such as the player's weapon in the case of first-person shooter games) is displayed. For example, a virtual three-dimensional gaming environment displayed pursuant to instructions of a gaming application via a video display in embodiments described herein may include an image of the player's avatar, an image of a non-player avatar (e.g., enemy avatar or ally avatar), and various objects (e.g., houses, cars, landscape, weapons, etc.). Each of these avatars and objects may move about the virtual three-dimensional gaming environment in which they are displayed, based on movement of the player's avatar pursuant to user instructions input via the keyboard or mouse. Gaming action events may also occur during gameplay, within the virtual three-dimensional gaming environment, such as weapons fire, explosions, or other forms of attack between game avatars and objects. Each of these gaming action events, avatars (e.g., player and non-player), and objects may be displayed within the virtual three-dimensional gaming environment such that they have three-dimensional coordinates (horizontal, vertical, and depth distance measurements) with respect to the player's avatar. A system is needed to provide haptic movement to represent such gaming action events at a haptic region of the keyboard or palm rest that correlates to the position (e.g., horizontal, vertical, and depth distance measurements) and type of the gaming action event within the virtual three-dimensional gaming environment. In other words, a system is needed to cause haptic movement at a region of the keyboard or palm rest having a position or motion with respect to the user that reflects or correlates to the position or type of the gaming action event with respect to the player's avatar within the virtual three-dimensional gaming environment.

The three-dimensional (3D) haptic keyboard and palm rest experience system in embodiments of the present disclosure provide such haptic movement feedback at one or more haptic regions of a combination keyboard and palm rest assembly correlating to the position or motion of a gaming action event within a virtual three-dimensional gaming environment. Piezoelectric actuators situated within a combination keyboard and palm rest assembly may provide the haptic movement in embodiments described herein. The piezoelectric actuators may be placed within multiple types of key assemblies in various embodiments described herein. For example, piezoelectric actuators capable of providing haptic movement pursuant to haptic commands received from the 3D haptic keyboard and palm rest experience system may be incorporated into plural key assemblies within mechanical key switches, or within dome/plunger type key switches. Further, one or more piezoelectric actuators may be situated across the width of the palm rest in some embodiments. Each of these piezoelectric actuators in embodiments described herein may operate to cause a vibration, click, bump, or other mechanical movement, upon receiving an electrical charge from a printed circuit board operably connected to a keyboard controller. The 3D haptic keyboard and palm rest experience system described in embodiments herein, may transmit a haptic command to the keyboard controller identifying a specific key or keys within the keyboard, or one or more portions of the palm rest at which haptic movement should occur.

The keyboard controller in embodiments described herein may transmit an electrical charge to a specific piezoelectric actuator through a circuit matrix (e.g., printed circuit board assembly), based on the key or portion of the palm rest identified in the haptic command received from the 3D haptic keyboard and palm rest experience system. Upon application of the electrical charge to the piezoelectric actuator by the keyboard controller, a piezoelectric disc within the piezoelectric actuator may be mechanically stretched or compressed so as to create a tactile haptic movement event such as the piezoelectric actuator warping up or down and returning to its pre-deformed state. This tactile haptic movement may be vibrational, a click, bump, or other mechanical movement.

The 3D haptic keyboard and palm rest experience system in embodiments of the present disclosure provides such haptic movement to specific portions of a keyboard or attached palm rest, based on identified gaming action events occurring within live gameplay. The 3D haptic keyboard and palm rest experience system in an embodiment may identify such live gameplay gaming action events using a plurality of different methods, including, for example, a trained image recognition model. In some embodiments, the 3D haptic keyboard and palm rest experience system may capture a plurality of images of gameplay during a training period. These training period captured images may include images of various avatars, or characters within the gaming environment. The avatars may be displayed in these captured training images at varying depths and viewing angles with respect to the player's perspective, and the avatars may be performing a variety of actions (e.g., firing or wielding a weapon, deflecting weapon's fire, moving toward or away from the player). The various avatars, which may also include an avatar of the user/player herself, as well as the actions taken by the avatars within each of these captured training images may be labeled to form a training dataset for an image recognition model.

These labeled, captured training images may then be input into an image recognition model in order to train the model to accurately identify the avatars and actions those avatars are taking within the captured training images. In some embodiments, the model may also be trained to identify a location (e.g., depth and orientation from the perspective of the player/user) and action motion within the virtual 3D gaming environment displayed by a video display device within the information handling system executing the gaming system. The image recognition model may be trained repeatedly on a plurality of such training datasets until the model can accurately make such identifications within a preset tolerance (e.g., 70% of the time or greater). Once the model is trained in such embodiments, captured images of live gameplay (e.g., images that have not yet been labeled to identify avatars or gaming action events) may by input into the trained image recognition model, which may then identify an avatar, avatar location, and gaming action events occurring within live gameplay as it is displayed via the video display. If the identified gaming action event (e.g., player avatar taking damage) is associated with a haptic response (e.g., vibration of a portion of the palm rest), the 3D haptic keyboard and palm rest experience system may transmit a haptic command to a keyboard controller of the information handling system to initiate haptic movement of a portion of the keyboard or palm rest having a position with respect to the user that correlates to the position of the gaming action event with respect to the player's avatar within the virtual three-dimensional gaming environment.

In another embodiment described herein, the 3D haptic keyboard and palm rest experience system may identify such live gameplay gaming action events by analyzing shifts in pixel brightness detected by firmware for the video display device. In many gaming scenarios, damage to the player avatar or a non-player game character avatar (e.g., enemy or ally) may be accompanied by a bright occurrence such as a weapon firing or an explosion occurring. Firmware for the video display device in an embodiment may measure these changes in brightness, their size, location, and speed in real-time during live gameplay. Such firmware real-time analysis methods exist in the art in order to record the lag between a player inputting a user instruction (e.g., fire weapon) and display of the player avatar taking the action pursuant to such received user instruction, for example. The 3D haptic keyboard and palm rest experience system in an embodiment may access these real-time pixel brightness measurements in some embodiments described herein to determine when a gaming action event has occurred (e.g., an avatar firing a weapon, performing another type of attack, taking damage), and the location (e.g., depth and angle with respect to the player) of the gaming action event as the action occurs during live gameplay. Such assessment of action events may be used to impart a motion component for the gaming action event across haptic feedback locations in the keyboard or the palm rest. In some embodiments, the 3D haptic keyboard and palm rest experience system may further determine whether the avatar is the player avatar or a non-player avatar. If the identified gaming action event (e.g., player avatar firing a weapon) is associated with a haptic response (e.g., vibration of one or more keys within the keyboard), the 3D haptic keyboard and palm rest experience system may transmit a haptic command to a keyboard controller of the information handling system to initiate haptic movement of a portion of the keyboard or palm rest having a position with respect to the user that correlates to the position or type of the gaming action event with respect to the player's avatar within the virtual three-dimensional gaming environment. Various haptic movement types (e.g., vibration, click, bump, or other mechanical movement), at varying intensity levels, durations, or patterns may correlate to various types of gaming action events (e.g., player avatar firing weapon, player avatar taking damage) in an embodiment.

The haptic command transmitted to the keyboard controller via the 3D haptic keyboard and palm rest experience system in embodiments described herein may identify a portion of a combination keyboard and palm rest assembly where haptic movement should occur. The portion of the combination keyboard and palm rest assembly (e.g., haptic region) in which haptic movement occurs in embodiments may depend upon the identified gaming action event, and the avatar taking such action or to which such action is applied. For example, the key (e.g., "F" key) on the keyboard that the player depresses in order to provide an instruction to fire a weapon may undergo haptic movement if the action identified in live gameplay is the player avatar firing a weapon. Such a haptic movement may indicate to the user that the weapon was fired, as instructed. In another example, one side (e.g., left side) of the palm rest may undergo haptic movement if the action identified in live gameplay is the player avatar taking damage. In still another example, another side (e.g., right side) of the palm rest may undergo haptic movement if the action identified in live gameplay is a non-player game character avatar (e.g., enemy or adversary) taking damage. In other embodiments, users may assign various actions to specific portions of the combination keyboard and palm rest assembly. For example, the user may assign the user-avatar taking damage to the right side of the palm rest, rather than a default left-side palm rest assignment.

In still other embodiments of the present disclosure, the portion of the combination keyboard and palm rest assembly that undergoes haptic movement may depend upon location of the identified action within the virtual 3D gaming environment in which the player avatar, non-player avatar (e.g., enemy or adversary), and identified gaming action event occur, as displayed via the video display device. As described above, the 3D haptic keyboard and palm rest experience system may identify a location (e.g., depth and orientation with respect to the user) of a gaming action event within the virtual 3D gaming environment displayed via the display device when identifying the avatar or gaming action event. For example, the 3D haptic keyboard and palm rest experience system may identify a non-user avatar taking damage within an upper-left portion of the displayed virtual 3D gaming environment, indicating the non-user avatar is located to the left, and far away from the player avatar.

The location of the portion of the combination keyboard and palm rest assembly that undergoes haptic movement in response to the detected gaming action event in such embodiments may reflect the position of detected gaming action event. For example, actions detected toward the right side of live gameplay images (e.g., as captured for analysis by the image recognition model or as analyzed for pixel brightness by the display firmware) may cause haptic movement in portions of the keyboard or the palm rest toward the right of center of the combination keyboard and palm rest assembly. As another example, actions detected toward the top of the live gameplay images (e.g., indicating a greater depth from the player) may cause haptic movement in portions of the keyboard situated furthest away from the user (e.g., number keys or function keys), while actions detected toward the bottom of the live gameplay images may cause haptic movements in portions of the palm rest situated nearest the user.

In some embodiments, haptic movement may occur in multiple haptic regions in response to a detected gaming action event within live gameplay. For example, a gaming action event undergoing movement within the gaming environment (e.g., an ally avatar firing a weapon from one side of the gaming environment toward an enemy avatar on the other side of the gaming environment, or an explosion rolling past the player avatar) may trigger a haptic command to initiate haptic movement beginning at a haptic region on one side of the keyboard or palm rest and moving across multiple haptic regions toward the other side of the keyboard or palm rest. In such a way, the 3D haptic keyboard and palm rest experience system and the combination keyboard and palm rest assembly may provide the user with haptic movement mimicking the location, from the perspective of the player's avatar, of gaming action events occurring during live gameplay and within the virtual 3D gaming environment. This may increase the user's immersion into the virtual 3D gaming environment of its avatar.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g., random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a haptic keyboard 114, a touchpad, one or more speakers, one or more microphones, ambient light sensors, a mouse, a video/graphic display 110, or any combination thereof. The information handling system 100 may also include a power management unit 118 supplying power to the information handling system 100, via a battery 117 or an alternating current (A/C) power adapter 119, one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Specifically, the processor 102 may operate to execute code instructions of firmware for the video/graphics display 110 in an embodiment. Moreover, the information handling system 100 may include memory such as main memory 104, static memory 106, or other memory of computer readable medium 122 storing instructions 124 of the three-dimensional (3D) haptic keyboard and palm rest experience system 132, and drive unit 116 (volatile (e.g., random-access memory, etc.), nonvolatile memory (read-only memory, flash memory etc.) or any combination thereof. A processor 102 may further provide the information handling system with a system clock for which a time of day clock may be tracked along with any location detector such as global positioning system or in coordination with a network interface device 120 connecting to one or more networks 128. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a haptic keyboard 114. Various drivers and control electronics may be operatively coupled to operate input devices 112 such as the haptic keyboard 114 and haptic palm rest 115 according to the embodiments described herein. Further, the information handling system 100 may include input/output devices 112, such as a one or more speakers or one or more microphones use along with the haptic keyboard 114 of embodiments according to the present disclosure. Various drivers and control electronics may be operatively coupled to operate input devices 112 such as the speakers, microphones, as well as the haptic keyboard 114 and haptic palm rest 115 according to the embodiments described herein.

The network interface device 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The network interface device 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one network interface device 120 may operate two or more wireless links.

Network interface device 120 may connect to any combination of macro-cellular wireless connections including 2G, 2.5G, 3G, 4G, 5G or the like. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. For example, a keyboard controller 130 may operate to transmit electrical charges to piezoelectric actuators located within the haptic keyboard 114 (or operatively coupled haptic palm rest 115), pursuant to haptic commands received from the 3D haptic keyboard and palm rest experience system 132, to cause a haptic movement (e.g., vibration, click, bump, or other mechanical movement) beneath specifically identified haptic regions of the haptic keyboard 114 (or operatively coupled haptic palm rest 115). As another example, firmware for the video display 110 may operate to measure and record magnitude, size, and speed of changes in pixel brightness during execution of a gaming application via processor 102. Such changes in brightness may, in some embodiments, be used in determination of gaming action events by a three-dimensional haptic keyboard and palm rest experience system 132 executable software code. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device 120.

The information handling system 100 may include a set of instructions 124 that may be executed to cause the computer system to perform any one or more of the methods or computer-based functions disclosed herein. For example, instructions 124 may execute a 3D haptic keyboard and palm rest experience system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs. In some embodiments, instructions 124 may comprise another application, such as executable code for a variety of software gaming system applications. A software gaming system application 124 in some embodiments may transmit instructions to the keyboard controller 130 or other haptic controller, indicating that an identified gaming action event that is associated with haptic movement of a portion or haptic region of the haptic keyboard 114 or haptic palm rest 115 has occurred.

The disk drive unit 116 and the 3D haptic keyboard and palm rest experience system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124. The disk drive unit 116 and static memory 106 may also contain space for data storage. Further, the instructions 124 may embody one or more of the methods or logic as described herein. For example, instructions relating to the 3D haptic keyboard and palm rest experience system 132, code instructions of various software gaming applications, software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The 3D haptic keyboard and palm rest experience system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the 3D haptic keyboard and palm rest experience system 132 that may be operably connected to the bus 108. The 3D haptic keyboard and palm rest experience system 132 computer readable medium 122 may also contain space for data storage. The 3D haptic keyboard and palm rest experience system 132 may, according to the present description, perform tasks related to identifying an gaming action events within live gameplay of a gaming application, associating that gaming action event with a haptic region of a combination haptic keyboard and palm rest assembly (e.g., one or more keys, or a portion of the palm rest), and causing haptic movement (e.g., vibration) to occur at the identified haptic region. The 3D haptic keyboard and palm rest experience system 132 in an embodiment may execute code instructions to identify the gaming action events and to identify the haptic region of the combination haptic keyboard and palm rest assembly (e.g., including haptic keyboard 114 and haptic palm rest 115) where haptic movement is appropriate, based on the identified gaming action event and its location.

The 3D haptic keyboard and palm rest experience system 132 in an embodiment may identify gaming action events displayed within live gameplay according to various methods described herein. For example, the 3D haptic keyboard and palm rest experience system 132 may detect gaming action events based on measured changes in pixel brightness in various regions of the video display 110, as recorded by firmware of the video display 110. As another example, the 3D haptic keyboard and palm rest experience system 132 may train an image recognition model to identify the avatars, objects, and associated gaming action events based on a plurality of captured images of training gameplay (e.g., captured prior to current or live gameplay). In such an embodiment, the training of the image recognition model may occur within the computing device incorporating the video display 110, haptic keyboard 114, and haptic palm rest 115, or may occur within a portion of the 3D haptic keyboard and palm rest experience system 132 operating in a cloud environment and communicably coupled to that computing device. As such, the 3D haptic keyboard and palm rest experience system 132 in some embodiments may operate in part upon a user-operated computing device executing code instructions of the gaming applications displayed via the video display 110, and in part at a cloud-based server or server remote from the user-operated computing device. Upon training a machine learning model, the 3D haptic keyboard and palm rest experience system 132 may detect gaming action events during gameplay that warrant haptic feedback via a machine learning inference model recognition of gaming action events, or by coded game instructions for haptic feedback during gameplay. As described herein, in some embodiments, a software gaming system application (e.g., 124) may have code instructions to transmit instructions to the keyboard controller 130, indicating that an identified gaming action event that is associated with haptic movement of a portion or haptic region of the haptic keyboard 114 or haptic palm rest 115 has occurred to generate haptic movement.

The 3D haptic keyboard and palm rest experience system 132 in such an embodiment may transmit a haptic command to the keyboard controller 130, including the identification of the haptic region of the combination haptic keyboard and palm rest assembly where the haptic movement is appropriate, and an instruction to initiate a haptic movement at that location.

In an embodiment of the present description, one or more of the keys of haptic keyboard 114, and portions of the haptic palm rest 115 may be associated with piezoelectric actuators. Upon receipt of the haptic command at the keyboard controller 130, the keyboard controller 130 may apply an electrical charge (e.g., via one or more printed circuit boards or other matrix circuits as described herein) to the piezoelectric actuator disposed within the haptic region of the haptic keyboard 114 and haptic palm rest 115 identified within the haptic command. The electrical charge applied to the piezoelectric actuator (i.e., having a specific current and voltage) may cause the piezoelectric actuator to convert that electrical charge into a mechanical stress by, for example, causing the piezoelectric actuator to warp upward or warp downward. The mechanical stress of the piezoelectric actuator due to the application of the electrical charge may be felt by a user as haptic movement of a key or a portion of the palm rest.

In an embodiment, the 3D haptic keyboard and palm rest experience system 132 may also include one or more sets of instructions that, when executed by a controller 130, a processor, or both, adjusts the polarity, voltage, or current of electrical charges applied to any piezoelectric actuator. This adjustment may be completed based on the desired haptic responses from the piezoelectric actuator, the lifespan of the piezoelectric actuator, the electrical characteristics of the piezoelectric actuator, the mechanical characteristics of the piezoelectric actuator, or combinations thereof. Because these characteristics may be different from one piezoelectric actuator to the other, the electrical charges applied to any given piezoelectric actuator by the keyboard controller 130 may be customized to produce a specific level of haptic movement (e.g., haptic movement feedback such as vibration, click, bump, or other mechanical movement in varying durations, intensities, or patterns) at any given key of haptic keyboard 114 or portion of an operatively coupled haptic palm rest 115. In an embodiment, the keyboard controller 130 of the information handling system 100 may access one or more look-up tables (e.g., movement look-up table). In this embodiment, the keyboard controller 130 of the information handling system 100 may access the look-up tables in order to determine characteristics (e.g., voltage magnitude, frequency, polarity) of an electrical charge to be applied to any given piezoelectric actuator to achieve known haptic movement intensity levels. The one or more sets of instructions of the 3D haptic keyboard and palm rest experience system 132 may also include one or more sets of instructions that, when executed by the keyboard controller 130, causes any number of subsequent voltage pulses to be applied to any piezoelectric actuator to generate haptic movement feedback such as vibration, click, bump, or other mechanical movement in varying durations, intensities, or patterns.

In an embodiment, the application of any current and voltage applied to any of the piezoelectric actuators associated with any of the keys of haptic keyboard 114 or operatively coupled haptic palm rest 115 may be dependent on an application being executed by the processor 102. By way of example, a user may be engaged in providing input, via the keys of the haptic keyboard 114, to a processor 102 in order to cause output to be provided. In a specific embodiment, the information handling system 100 may execute a basic input/output system (BIOS). In an embodiment, the 3D haptic keyboard and palm rest experience system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard or touchpad driver software, firmware, controllers and the like may communicate with applications on the information handling system 100. Similarly, video display driver software, firmware, controllers and the like may communicate with applications on the information handling system 100 as well as with the piezo keyboard driver in some embodiments herein. For example, video display 110 may include display scalar hardware operating to emit light at varying brightness levels via a plurality of pixels of the video display 110. Further, firmware for the video display 110 in an embodiment may operate to monitor changes in brightness at each of these pixels in order to detect pixel regions within the video display 110 undergoing changes in brightness (e.g., due to display of an explosion during live gameplay) indicating an gaming action event.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
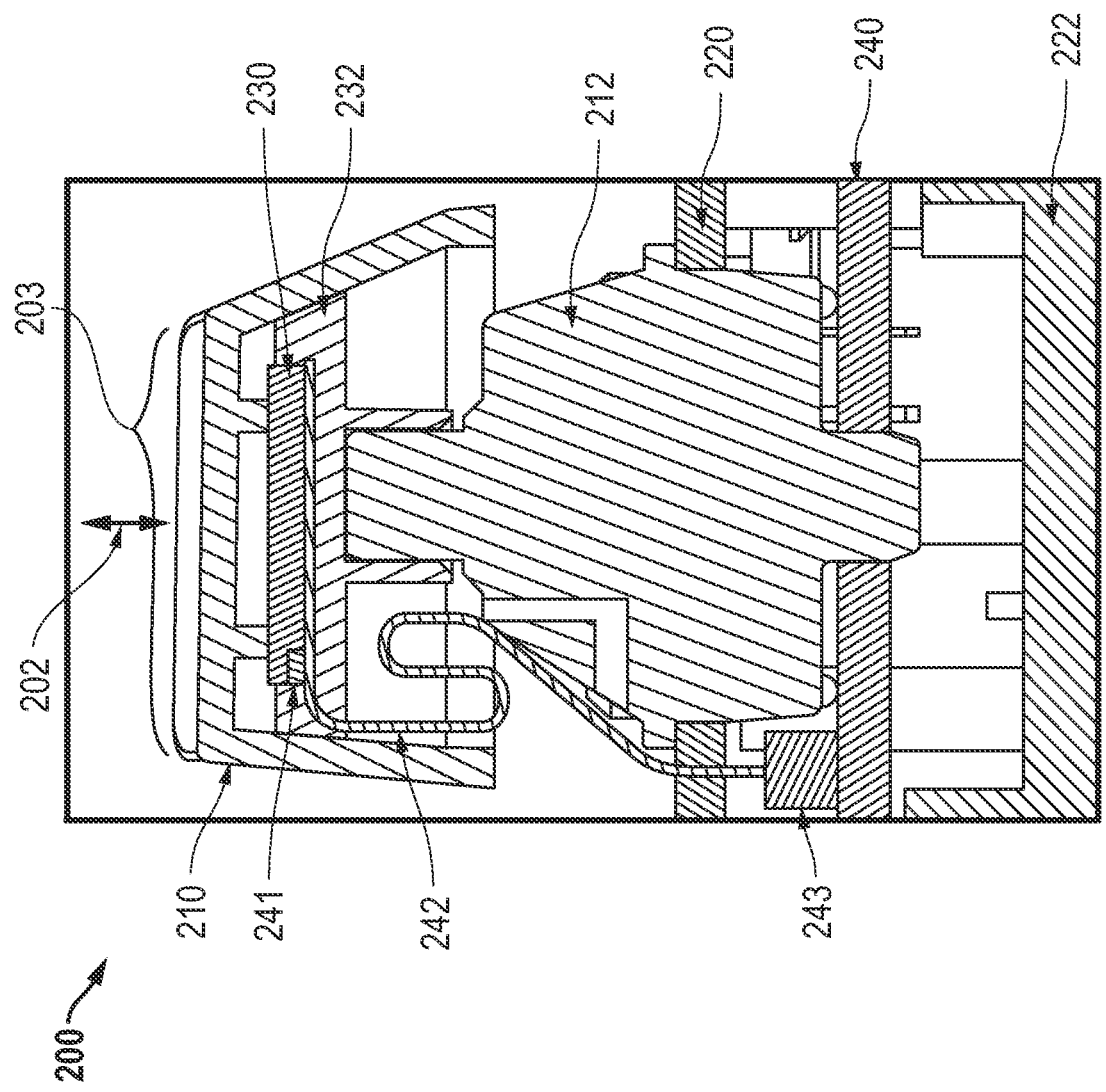
FIG. 2 is a side cut-out view of a mechanical key assembly of a haptic keyboard implementing a piezoelectric actuator according to an embodiment of the present disclosure.

FIG. 2 is a side cut-out view of a mechanical key assembly 200 of a haptic keyboard which may be combined with a haptic palm rest assembly implementing a piezoelectric actuator according to an embodiment of the present disclosure. As described herein, piezoelectric actuators may be situated within a mechanical key assembly 200 of a haptic keyboard to provide haptic movement. For example, a piezoelectric actuator 230 capable of providing haptic movement to a user whose finger is in contact with the key cap 210 pursuant to haptic commands received from a three-dimensional (3D) haptic keyboard and palm rest experience system may be incorporated within mechanical key assemblies.

A mechanical key assembly 200 in an embodiment may include a key cap 210 that a user presses downward in order to register a keystroke. A piezoelectric actuator 230 may be incorporated within the key cap 210 structure, such that the piezoelectric actuator 230 is disposed between the key cap 210 and the top surface of the mechanical switch 212 to which the key cap 210 is joined. For example, a piezoelectric actuator holder plug 232 may be inserted within the key cap 210 to hold the piezoelectric actuator 230 in place. The piezoelectric actuator holder plug 232 in an embodiment may include a cavity in its top surface for housing the piezoelectric actuator 230, and may have outer dimensions allowing the lateral sides of the piezoelectric actuator holder plug 232 to lie flush with interior walls of the key cap 210. The piezoelectric actuator holder plug 232 in such an embodiment may further include a fitting or bracket protruding from its bottom surface allowing for insertion into or interfacing with the top surface of the mechanical key switch 212 therewithin. The piezoelectric actuator holder plug 232 in such an embodiment may be mounted upon a mechanical keyboard switch 212.

The mechanical switch 212 may include any mechanical switch used in the art. For example, the mechanical switch 212 may be any of a variety of Cherry® mechanical switches, including tactile, clicky, or linear switches. The mechanical switch 212 may be mounted to a keyboard main printed circuit board assembly 240, which may operate to receive an electrical charge when the key cap 210 is depressed by the user, thus detecting that a keystroke has occurred. A keyboard bottom cover 222 may be situated beneath the keyboard main printed circuit board assembly 240, so as to partially enclose the mechanical key assembly 200 between a keyboard top cover 220 and the keyboard bottom cover 222.

The keyboard main printed circuit board assembly 240 may also be operably connected to the piezoelectric actuator 230 via a flexible printed circuit board 242 in an embodiment. The flexible printed circuit board 242 in such an embodiment may include at least two electrically conductive wires, each operably connected (e.g., by soldering) to a contact 243 between the keyboard main printed circuit board 240 and the flexible printed circuit board 242, and to a contact 241 between the piezoelectric actuator 230 and the flexible printed circuit board 242. FIG. 2 illustrates a single contact 243 between the keyboard main printed circuit board 240 and the flexible printed circuit board 242 because it provides a cut-out side view. However, the keyboard main printed circuit board 240 may be operably connected to the flexible printed circuit board 242 at two or more such contact points (e.g., 243), such that each of at least two conductive wires within the flexible printed circuit board 242 is operably connected to the keyboard main printed circuit board assembly 240 at separate contact points (e.g., 243). Similarly, FIG. 2 illustrates a single contact 241 between the flexible printed circuit board 242 and the piezoelectric actuator 230, but the flexible printed circuit board 242 may be operably connected to the piezoelectric actuator 230 at two or more such contact points (e.g., 241). In such a way, each of at least two conductive wires within the flexible printed circuit board 242 may be operably connected to the piezoelectric actuator 230 at separate contact points (e.g., 241) in an embodiment.

As described herein, the mechanical key assembly 200 in an embodiment may operate to provide haptic movement to a user in contact with the key assembly 200 (or a nearby surface of the combination haptic keyboard and palm rest assembly incorporating the key assembly 200), pursuant to a haptic command generated by the 3D haptic keyboard and palm rest experience system. In an embodiment, the 3D haptic keyboard and palm rest experience system may generate such an instruction upon detecting occurrence of a specific gaming action event within a virtual 3D gaming environment displayed via a video display of the information handling system (e.g., information handling system 100 described with reference to FIG. 1). The haptic command may include an identification of a specific key assembly (e.g., 200) or portion of a palm rest at which haptic movement should occur. This key assembly or palm rest location may be correlated to type of gaming action event identified, the avatar performing such a gaming action event, the avatar upon whom the gaming action event is taken, or the location of the gaming action event identified within the virtual 3D gaming environment displayed via the video display, as described in greater detail with respect to FIGS. 5-6. The 3D haptic keyboard and palm rest experience system may transmit this haptic command to a keyboard controller operably connected to the keyboard main printed circuit board assembly 240 in an embodiment.

The mechanical key assembly 200 in an embodiment may be one of several key assemblies situated within a combination haptic keyboard and palm rest assembly. Each of these key assemblies may be operably connected to the keyboard main printed circuit board assembly 240, such that the piezoelectric actuators (e.g., 230) incorporated within each key assembly (e.g., 200) may execute haptic movement independently from one another, pursuant to electrical charges delivered via the keyboard main printed circuit board assembly 240. For example, upon receipt of the haptic command specifically identifying the key assembly 200 in an embodiment, the keyboard controller may transmit an electrical charge through a matrix circuit incorporated within the keyboard main printed circuit board assembly 240 to the flexible printed circuit board 242. The flexible printed circuit board 242 in an embodiment may then deliver this electrical charge to the piezoelectric actuator 230 via contact 241. Upon application of the electrical charge to the piezoelectric actuator 230 by the keyboard controller, a ceramic disc within the piezoelectric actuator 230 may be mechanically stretched or compressed so as to create a tactile haptic movement event such as the piezoelectric actuator warping up or down and returning to its pre-deformed state in a clicking, bumping, vibrating, or other manner of mechanical movement. This may cause the haptic movement 202 of the key cap 210, within the haptic feedback region 203, felt by the fingertip or hand of the user.

The haptic command received by the keyboard controller in an embodiment may identify various electrical charge magnitudes to apply to the piezoelectric actuator 230, and in varying pulse patterns. Varying the magnitude of the electrical charge applied across the piezoelectric actuator disc in an embodiment may vary the intensity with which the piezoelectric actuator 230 and consequently the key cap 210 undergoes haptic movement 202 (e.g., vibrates, clicks, bumps). Certain live gameplay gaming action events may be associated with greater haptic movement intensity than others in an embodiment. For example, a non-player avatar, such as an ally avatar taking damage may prompt haptic movement 202 of a lower intensity than haptic movement associated with the player avatar taking damage. In addition, certain live gameplay gaming action events may be associated with specific haptic movements (e.g., vibrational or pulse patterns) in an embodiment. For example, the player avatar firing a weapon may be associated with a single, short burst or vibration, while the player avatar taking damage may be associated with a longer duration haptic movement. Thus, the haptic command in an embodiment may identify the magnitude, duration, or pattern of application of the electrical charge to be applied to the piezoelectric actuator 230 by the keyboard controller via the keyboard main printed circuit board assembly 240. In such a way, the keyboard controller may initiate haptic movement 202 in an embodiment pursuant to a haptic command received from the 3D haptic keyboard and palm rest experience system.

Figure 3:
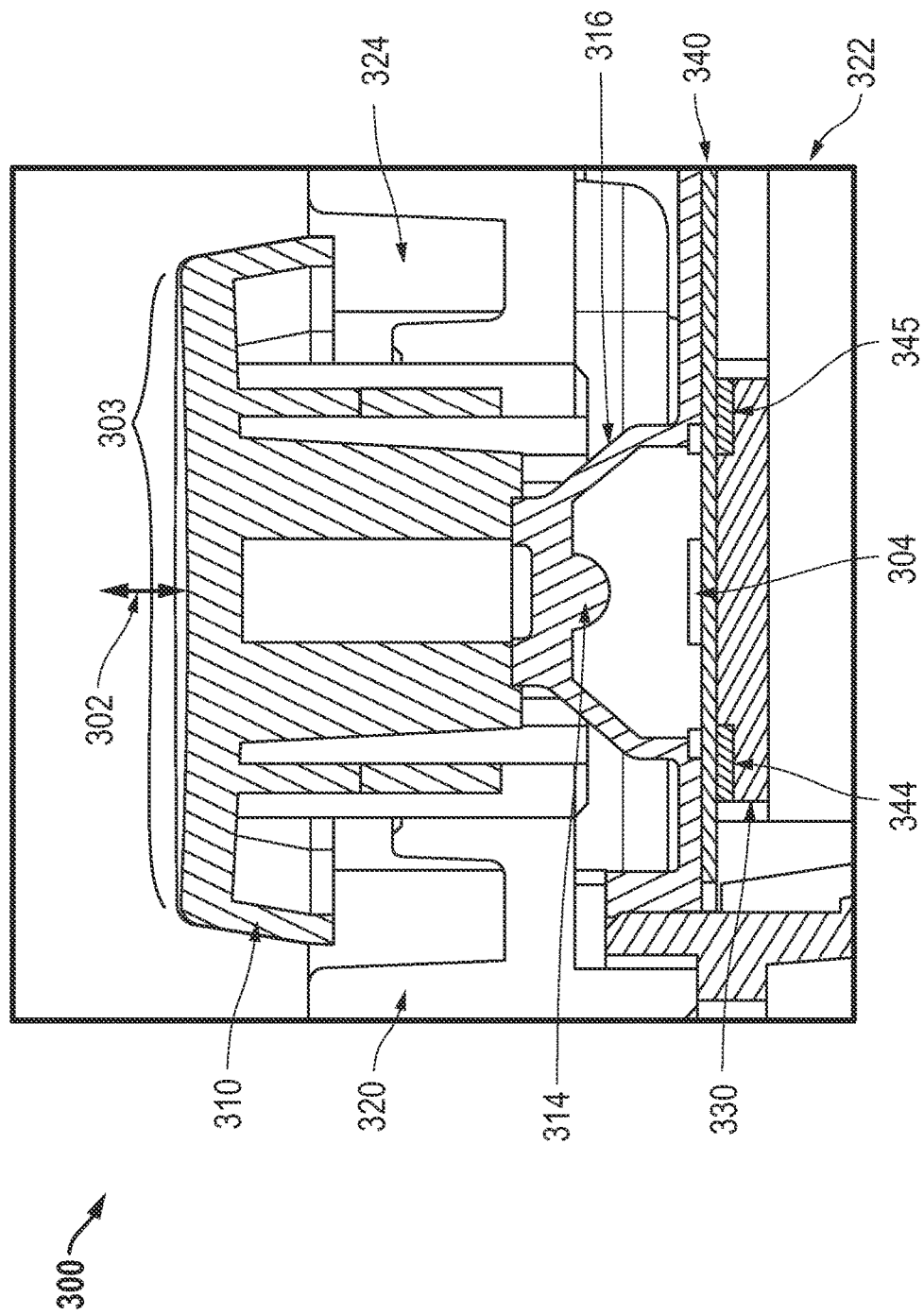
FIG. 3 is a side cut-out view of a dome-type key assembly of a haptic keyboard implementing a piezoelectric actuator according to an embodiment of the present disclosure.

FIG. 3 is a side cut-out view of a dome-type key switch 300 of a combination haptic keyboard and palm rest assembly implementing a piezoelectric actuator according to an embodiment of the present disclosure. As described herein, piezoelectric actuators may be situated within a dome-type key assembly 300 of a haptic keyboard to provide haptic movement 302 (e.g., vibration, click, bump, or other mechanical movement of varying duration, intensity, or patterns) within the haptic feedback region 303. For example, a piezoelectric actuator 330 capable of providing haptic movement to a user whose finger is in contact with the key cap 310 pursuant to haptic commands received from a three-dimensional (3D) haptic keyboard and palm rest experience system may be incorporated within dome-type key assemblies.

A dome-type key assembly 300 in an embodiment may include a key cap 310 that a user presses downward in order to register a keystroke. The key cap 310 in an embodiment may be situated atop a flexible dome plunger structure 316, having a dome 314 protruding from the dome plunger structure 316 bottom surface. The dome plunger structure 316 in such an embodiment may be mounted atop a keyboard main printed circuit board assembly 340, directly above a pressure sensor 304 operably attached to the keyboard main printed circuit board assembly 340. Upon application of downward pressure on the key cap 310 by a user, the key cap 310 may move downward until the outer walls of the key cap 310 are inserted within a cavity 324 of the keyboard top cover 320, allowing the top surface of the key cap 310 to lie substantially flush with the top surface of the keyboard top cover 320. The dome 314 within the concave bottom surface of the dome plunger 314 may also depress downward during such application of downward force by the user, until the dome 314 comes into contact with the pressure sensor 304. This contact between the dome 314 and the pressure sensor 304 may generate an electrical impulse or charge that is transmitted to the keyboard main printed circuit board assembly 340 in an embodiment, in order to register that a keystroke has occurred.

A piezoelectric actuator may be disposed beneath the keyboard main printed circuit board assembly 340 for generation of haptic movement of the key cap 310 pursuant to a haptic command received from the 3D haptic keyboard and palm rest experience system in an embodiment. A keyboard bottom cover 322 in an embodiment may be situated beneath the piezoelectric actuator 330 so as to partially enclose the dome-type key assembly 300 between the keyboard top cover 320 and the keyboard bottom cover 322. In embodiments, the keyboard bottom cover 322 may also be referred to herein as a keyboard support chassis.

In an embodiment, the 3D haptic keyboard and palm rest experience system may generate a haptic command upon detecting occurrence of a specific gaming action event within a virtual 3D gaming environment displayed via a video display of the information handling system (e.g., information handling system 100 described with reference to FIG. 1). The haptic command may include an identification of a specific key assembly (e.g., 300) or portion of a palm rest at which haptic movement should occur. This key assembly or palm rest location may be correlated to the type of gaming action event identified, the avatar performing such a gaming action event, the avatar upon whom the gaming action event is taken, or the location of the gaming action event identified within the virtual 3D gaming environment displayed via the video display, as described in greater detail with respect to FIGS. 5-6. The 3D haptic keyboard and palm rest experience system may transmit this haptic command to a keyboard controller operably connected to the keyboard main printed circuit board assembly 340 in an embodiment.

The dome-type key assembly 300 in an embodiment may be one of several key assemblies situated within a combination haptic keyboard and palm rest assembly. Each of these key assemblies may be operably connected to the keyboard main printed circuit board assembly 340, such that the piezoelectric actuators (e.g., 330) incorporated within each key assembly (e.g., 300) may execute haptic movement independently from one another, pursuant to electrical charges delivered via the keyboard main printed circuit board assembly 340. For example, upon receipt of the haptic command specifically identifying the key assembly 300 in an embodiment, the keyboard controller may transmit an electrical charge through a matrix circuit incorporated within the keyboard main printed circuit board assembly 340 to the piezoelectric actuator 330 via contacts 344 and 345. Upon application of the electrical charge to the piezoelectric actuator 330 by the keyboard controller, a ceramic disc within the piezoelectric actuator 330 may be mechanically stretched or compressed so as to create a tactile haptic movement event such as the piezoelectric actuator warping up or down and returning to its pre-deformed state in a clicking, bumping, vibrating, or other manner of mechanical movement. This may cause the haptic movement 302 of the key cap 310, felt by the fingertip or hand of the user.

Similar to the haptic command described with reference to FIG. 2, the haptic command received by the keyboard controller in an embodiment may identify various electrical charge magnitudes to apply to the piezoelectric actuator 330, and in varying pulse patterns. In such a way, the keyboard controller may initiate haptic movement 202 in an embodiment pursuant to a haptic command received from the 3D haptic keyboard and palm rest experience system.

Figure 4A:
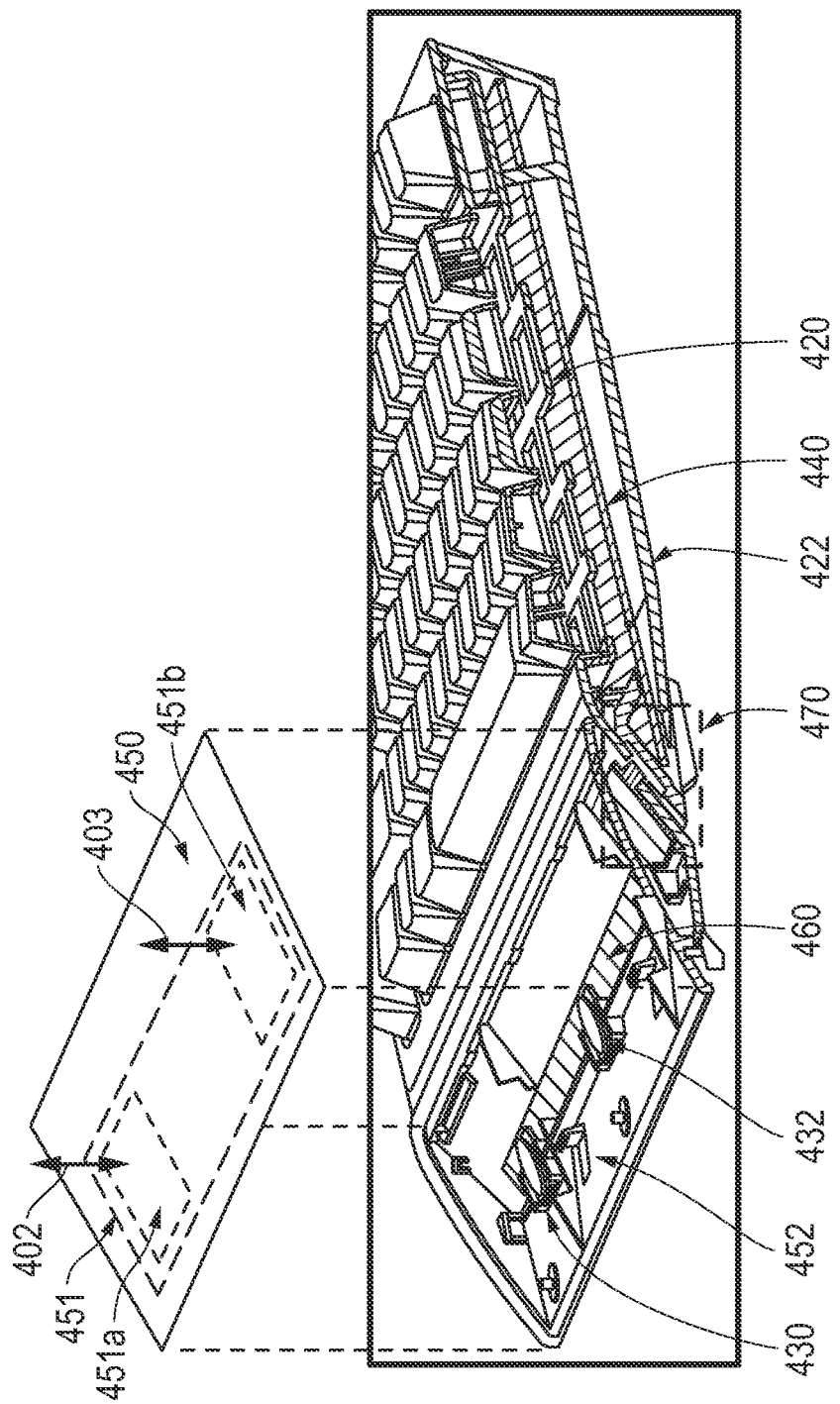
FIG. 4A is side cut-out view of a palm rest portion of a haptic keyboard implementing a piezoelectric actuator according to an embodiment of the present disclosure.

FIG. 4A is a side cut-out view of a palm rest portion 425 of a combination haptic keyboard and palm rest assembly implementing a piezoelectric actuator according to an embodiment of the present disclosure. As described herein, one or more piezoelectric actuators may be situated across the width of the palm rest 425 of a combination haptic keyboard and palm rest assembly in some embodiments. For example, a combination haptic keyboard and palm rest assembly in an embodiment may include a keyboard that includes a plurality of key assembly partially enclosed between a keyboard top cover 420 and a keyboard bottom cover 422, and a palm rest 425 enclosed by a palm rest top cover 450, and a palm rest bottom cover 452. A palm rest printed circuit board assembly 460 and a plurality of piezoelectric actuators (e.g., first or left palm rest piezo electric actuator 430 and second or right palm rest piezoelectric actuator 432) may be incorporated within the palm rest 425 of the combination haptic keyboard and palm rest assembly in an embodiment. On the right side of palm rest 425 (not shown due to cut-away) additional piezoelectric actuators may be disposed (e.g., third and fourth palm rest piezoelectric actuators) for a user's right hand in some embodiments.

Figure 4B:
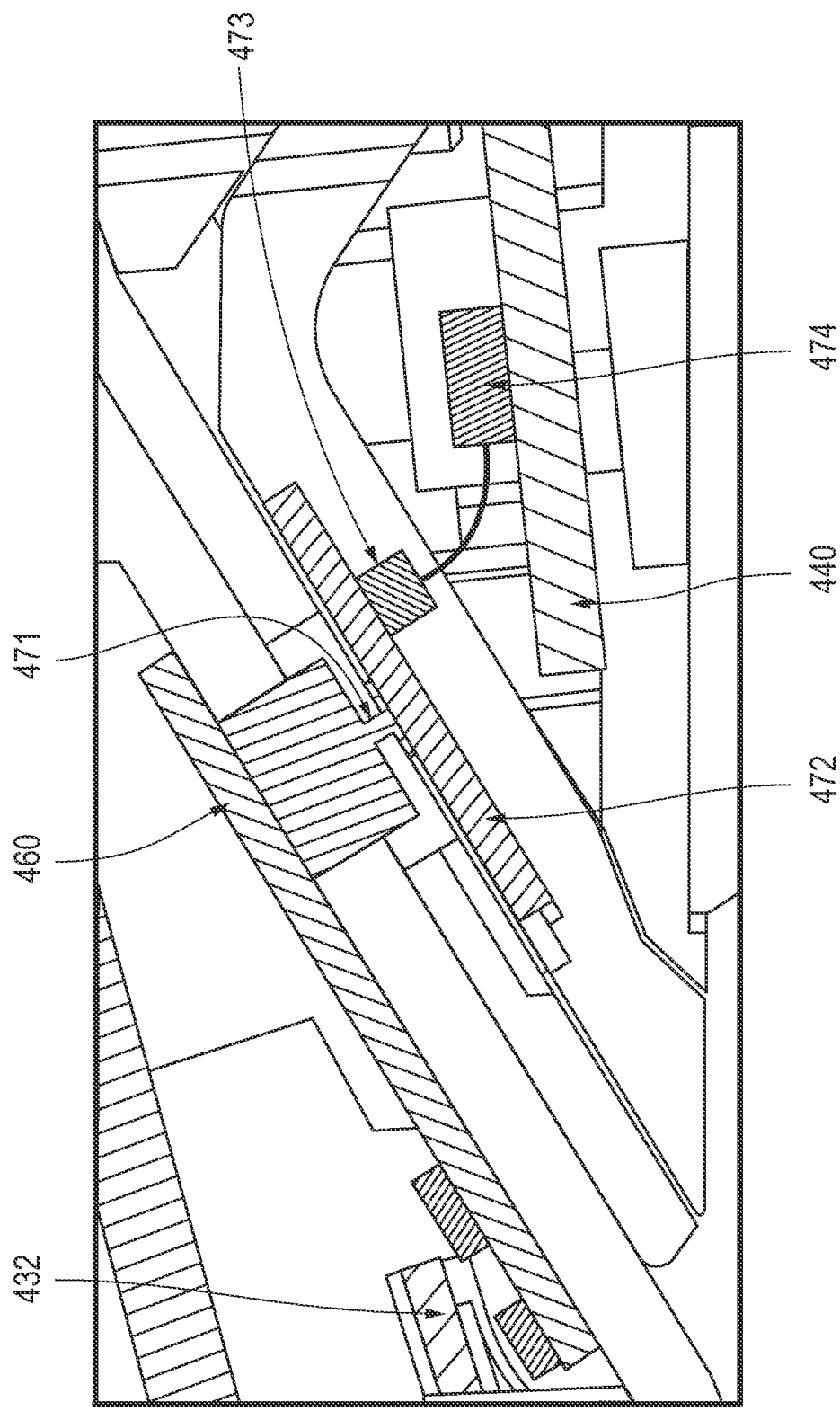
FIG. 4B is another side cut-out view of a haptic keyboard and palm rest assembly junction according to an embodiment of the present disclosure.

The palm rest printed circuit board assembly 460 may be operably connected to a keyboard main printed circuit board assembly 440 via a palm rest junction 470 with the keyboard, as described in greater detail with respect to FIG. 4B. The keyboard main printed circuit board assembly 440 may receive a haptic command from the 3D haptic keyboard and palm rest experience system, via a keyboard controller in an embodiment, as described herein. For example, in an embodiment, the 3D haptic keyboard and palm rest experience system may generate a haptic command upon detecting occurrence of a specific gaming action event within a virtual 3D gaming environment displayed via a video display of the information handling system (e.g., information handling system 100 described with reference to FIG. 1). The haptic command may include an identification of a specific haptic zone 451 of a palm rest at which haptic movement should occur. This palm rest haptic zone 451 may be correlated to the type of gaming action event identified, the avatar performing such a gaming action event, the avatar upon whom the gaming action event is taken, or the location of the gaming action event identified within the virtual 3D gaming environment displayed via the video display, as described in greater detail with respect to FIGS. 5-6. In some embodiments, haptic zone 451 may have a single piezo electric haptic actuator to form a single haptic region or may be split into two or more haptic regions (e.g., 451*a* and 451*b*) within haptic zone 451 with plural piezo electric actuators. Embodiments described below discuss an embodiment with plural haptic regions within a haptic zone. Additional embodiments may include haptic keys of a keyboard or sets of haptic keys as additional haptic regions. The 3D haptic keyboard and palm rest experience system may transmit this haptic command to a keyboard controller operably connected to the keyboard main printed circuit board assembly 440 in an embodiment. In other embodiments, one or more controllers may be used to receive haptic commands for the haptic keyboard or haptic palm rest in the keyboard main printed circuit board assembly 440. Any combination of controllers is contemplated in various embodiments as needed.

Each of the piezoelectric actuators (e.g., 430 and 432) situated beneath the palm rest top cover 450 in an embodiment may execute haptic movement independently from one another, pursuant to electrical charges delivered via the keyboard main printed circuit board assembly 340. For example, upon receipt of the haptic command specifically identifying the left palm rest haptic zone 451 in an embodiment, the keyboard controller may transmit an electrical charge through a matrix circuit incorporated within the keyboard main printed circuit board assembly 440 to the palm rest printed circuit board assembly 460 to either piezo actuator 430 or 432 for haptic feedback to a user's left palm. If a haptic response to a left haptic region 451*a* of haptic zone 451 is required, an electrical charge is sent to piezoelectric actuator 430. The piezoelectric actuator 430 in such an embodiment may then receive the electrical charge from the palm rest printed circuit board assembly 460. Upon application of the electrical charge to the piezoelectric actuator 430 by the keyboard controller, a ceramic disc within the piezoelectric actuator 430 may be mechanically stretched or compressed so as to create a tactile haptic movement event such as the piezoelectric actuator warping up or down and returning to its pre-deformed state in a clicking, bumping, vibrating, or other manner of mechanical movement of varying intensities, durations, or patterns. This may cause the haptic movement 402 of the palm rest top cover 450, at haptic region 451*a*, felt by the left hand of the user laying atop or in close contact with the palm rest top cover 450. Similar to the haptic command described with reference to FIG. 2, the haptic command received by the keyboard controller in an embodiment may identify various electrical charge magnitudes or haptic movement types to apply to the piezoelectric actuator 430, and in varying pulse patterns.

If a haptic response to a right haptic region 451*b* of haptic zone 451 is required, an electrical charge is sent to piezoelectric actuator 432. The piezoelectric actuator 432 in such an embodiment may then receive the electrical charge from the palm rest printed circuit board assembly 460. Upon application of the electrical charge to the piezoelectric actuator 432 by the keyboard controller, a ceramic disc within the piezoelectric actuator 432 may be mechanically stretched or compressed so as to create a tactile haptic movement event such as the piezoelectric actuator warping up or down and returning to its pre-deformed state in a clicking, bumping, vibrating, or other manner of mechanical movement of varying intensities, durations, or patterns. This may cause the haptic movement 403 of the palm rest top cover 450, at haptic region 451b, felt by the left hand of the user laying atop or in close contact with the palm rest top cover 450. Similar to the haptic command described with reference to FIG. 2, the haptic command received by the keyboard controller in an embodiment may identify various electrical charge magnitudes or haptic movement types to apply to the piezoelectric actuator 432, and in varying pulse patterns.

The location of the palm rest haptic region (e.g., 451a or 451b) that undergoes haptic movement in response to the gaming action event detected by the 3D haptic keyboard and palm rest experience system in an embodiment may reflect the position of the detected gaming action event within the virtual three-dimensional gaming environment. For example, gaming action events detected toward the right side of live gameplay images (e.g., as captured for analysis by the image recognition model or as analyzed for pixel brightness by the display firmware) may cause haptic movement in a palm rest haptic region (e.g., 451b) situated closer to the right-hand side of the palm rest top cover 450. In some embodiments, haptic movement may occur in multiple haptic regions in response to a detected gaming action event within live gameplay. For example, both a user's left and right palms may be engaged with the haptic palm rest 425 and keys. In others, only the user's left or right palm may be engaged (e.g., while the other hand uses a mouse or other input/output device). For example, a gaming action event undergoing movement within the gaming environment (e.g., an ally avatar firing a weapon from one side of the gaming environment toward an enemy avatar on the other side of the gaming environment) may trigger a haptic command to initiate haptic movement beginning at a haptic region (e.g., 451a) on one side of the palm rest top cover 450 and moving across multiple haptic regions of the palm rest top cover 450, toward the other side (e.g., 451b) of the palm rest top cover 450. In such a way, the 3D haptic keyboard and palm rest experience system and the combination keyboard and palm rest assembly may provide the user with haptic movement mimicking the location, from the perspective of the player's avatar, of gaming action events occurring during live gameplay and within the virtual 3D gaming environment. This may increase the user's immersion into the virtual 3D gaming environment of its avatar.

FIG. 4B is a side cut-out view of a combination haptic keyboard and palm rest assembly junction between a keyboard portion and a palm rest portion according to an embodiment of the present disclosure. As described herein, the palm rest printed circuit board assembly 460 may be operably connected to a keyboard main printed circuit board assembly 440 within a palm rest junction 470 with the keyboard. The keyboard main printed circuit board assembly 440 in an embodiment may be so operably connected to the palm rest printed circuit board assembly 460 such that an electrical charge may be transmitted to the palm rest printed circuit board assembly 460 via the keyboard main printed circuit board assembly 440, pursuant to a haptic command received from the keyboard controller operably connected to the keyboard main printed circuit board assembly 440. For example, the keyboard main printed circuit board assembly 440 may be operably connected to a junction printed circuit board assembly 472 via a wire or bus joining the contact (e.g., solder point) 473 and the contact 474. A plurality of spring-loaded connector pins (e.g., 471), such as a pogo pin, may be situated between the junction printed circuit board assembly 472 and the palm rest printed circuit board assembly 460. Each pogo pin (e.g., 471) in an embodiment may operate to couple an electrically conductive circuit within the junction printed circuit board assembly 472 to an electrically conductive circuit comprised by a portion of the internal wiring of the palm rest printed circuit board assembly 460 and one of the piezoelectric actuators (e.g., 432) situated within the palm rest assembly 425. Thus, the junction printed circuit board 472, pogo pin 471 (and other pogo pins), the palm rest printed circuit board assembly 460 and each of the piezoelectric actuators (e.g., 432) situated within the palm rest assembly 425 may be electrically coupled such that an electrical pulse generated at the keyboard main printed circuit board assembly 440 or at the junction printed circuit board assembly 472 may be transmitted via one of the pogo pins (e.g., 471), through a portion of the palm rest printed circuit board assembly 460 to one of the piezoelectric actuators (e.g., 432) situated within the palm rest. The haptic piezo actuator thus sends or received electrical signals from a chip driver that is mounted on a keyboard main printed circuit board (PCB) or may be mounted on a secondary board. The chip driver then sends or receives electrical signals with a microprocessor on the keyboard PCB or on an auxiliary board for executing code instructions of at least a portion of the 3D haptic keyboard and palm rest experience system. The microprocessor on the keyboard PCB may also communicate with the processors of the information handling system executing some aspects of the 3D haptic keyboard and palm rest experience system via a USB or other connection between the keyboard and the motherboard of the information handling system.

Figure 5:
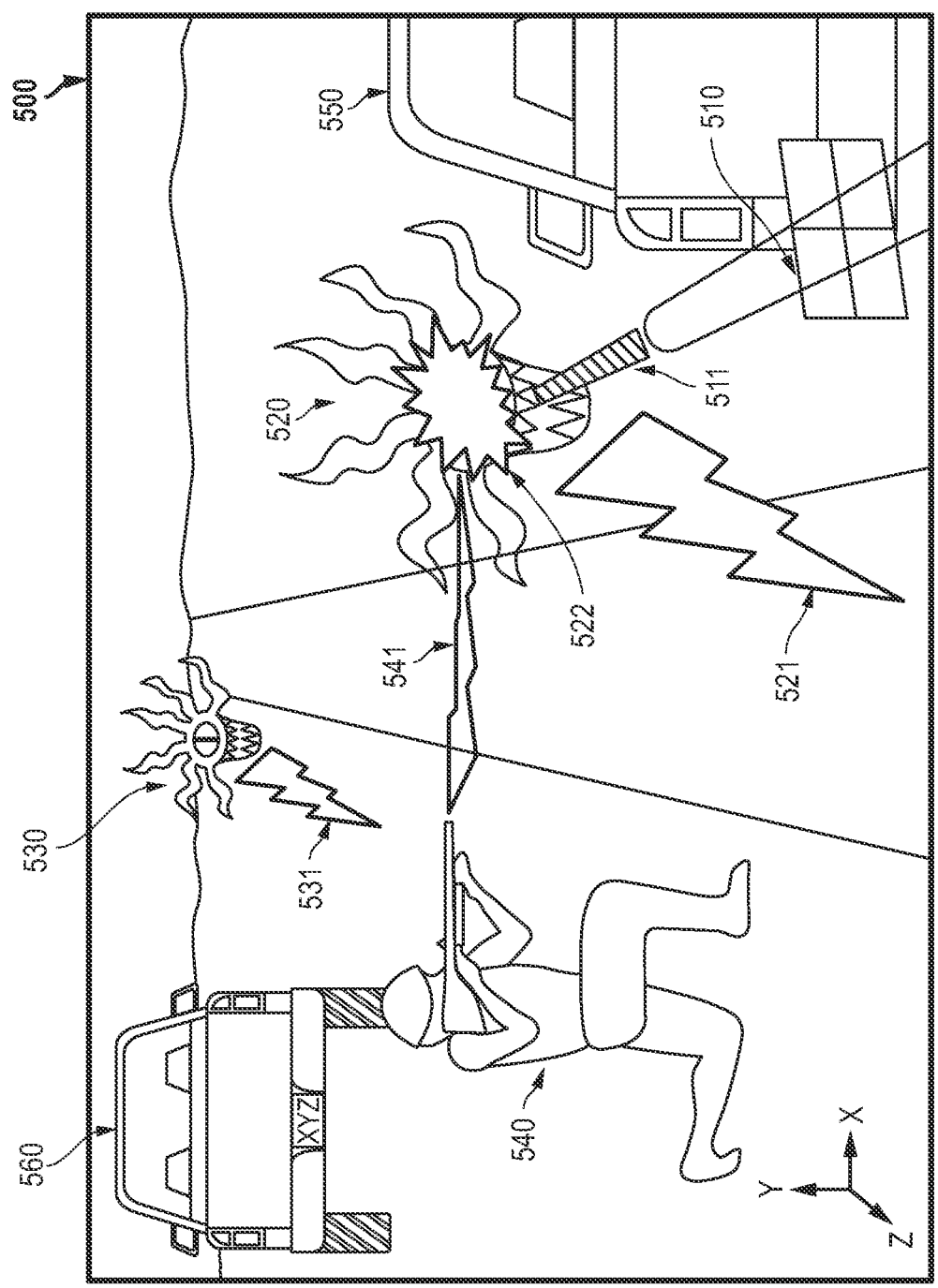
FIG. 5 is an image of virtual three-dimensional gaming environment according to an embodiment of the present disclosure.

FIG. 5 is an image of virtual three-dimensional gaming environment in which avatars perform gaming action events in specific locations with respect to a player's perspective according to an embodiment of the present disclosure. As described herein, the 3D haptic keyboard and palm rest experience system in an embodiment may provide haptic movement at a region of the keyboard or palm rest having a position with respect to the user that reflects or correlates to the position of a gaming action event with respect to the player's avatar within a virtual three-dimensional gaming environment 500. Such a virtual three-dimensional gaming environment 500 in an embodiment may display a player avatar 510 (often represented by a weapon held by the avatar) performing actions (e.g., firing a weapon or performing some other player attack gaming action event 511) pursuant to user instructions input via the keyboard or mouse. One or more non-player avatars may also be displayed within the virtual three-dimensional gaming environment 500, such as an enemy avatar (e.g., 520, or 530), or an ally avatar 540. The actions of the enemy avatar (e.g., 520 or 530) in an embodiment may be controlled by the gaming application in some embodiments. In other embodiments, the actions of the enemy avatar (e.g., 520 or 530), as well as the actions of the ally avatar 540 may be controlled by input received from other users (e.g., not the user of the combination haptic keyboard and palm rest assembly described herein) in communication with the gaming application via a network. The virtual three-dimensional gaming environment 500 may further include inanimate objects such as buildings, weapons, non-interactive characters, or vehicles (e.g., 550 and 560).

Each of the avatars and objects may be displayed within the virtual three-dimensional gaming environment 500 at a specific location (e.g., orientation and depth, or Euclidian coordinates (X, Y, Z)) with respect to the player avatar 510. One or more of the avatars may be involved in some sort of gaming action event in an embodiment, such as firing a weapon or performing some other form of attack, and receiving damage from such an attack. For example, the player avatar 510 may perform a player attack gaming action event 511, displayed as a specifically colored ejection 511 leaving the player avatar's weapon 510 (e.g., emulating gun fire). As another example, the enemy avatar 520 may initiate an enemy attack gaming action event 521 on the player's avatar, displayed as a bright pulse emulating bolt of electricity. In still other examples, another enemy avatar 530 may initiate an enemy avatar attack gaming action event 531 on a non-player or ally avatar 540, or the non-player or ally avatar 540 may initiate an ally attack gaming action event 541 on the enemy avatar 520. In some embodiments, a gaming action event may occur when an avatar (e.g., player, ally, or enemy) takes damage from an incoming attack. For example, either the ally avatar attack 541 or the player avatar attack 511 may cause the enemy avatar 520 to incur a damage gaming action event 522. These are only examples of gaming action events that may occur within gameplay, and are meant to be illustrative rather than restrictive. Other gaming action events may include any action allowable by any avatar or character within a gaming application, including wielding of any weapon, initiation of conversation, casting of a spell, use of a telekinetic power, etc.

The gaming action events, objects, and avatars displayed within the virtual three-dimensional gaming environment 500 in an embodiment may each have a three-dimensional position with respect to the player avatar 510. The location of such avatars, objects, and gaming action events with respect to the player avatar in an embodiment may be determined based on the position and size of the avatar, object, or gaming action event as it is displayed from the perspective of the player avatar 510. For example, the smaller size of the enemy avatar 530 in comparison with the enemy avatar 520 in an embodiment may indicate the enemy avatar 530 is located further away (e.g., at a greater depth) from the player avatar 510 than the enemy avatar 520. As another example, the position of the ally avatar 540 to the far-left of the virtual three-dimensional gaming environment 500 in an embodiment may indicate the ally avatar 540 is located ahead of the player avatar 510, and to the player avatar's left (e.g., at the player avatar's 11:00 position). Thus, the location of a gaming action event, object, or non-player avatar with respect to the player avatar 510 in an embodiment may be determined through analysis of a displayed image of the virtual three-dimensional gaming environment 500.

As described herein, the 3D haptic keyboard and palm rest experience system in an embodiment may identify gameplay gaming action events occurring within the virtual three-dimensional gaming environment 500 using a plurality of different methods, including, for example, a trained image recognition model. In such an embodiment, the 3D haptic keyboard and palm rest experience system may capture a plurality of images, such as the image shown in FIG. 5, of gameplay during a training period. These training period captured images may include images of various avatars (e.g., 510, 520, 530, or 540) displayed at varying depths and viewing angles with respect to the player's perspective. The avatars may be performing a variety of gaming action events (e.g., 511, 521, 522, 531, or 541). The various avatars (e.g., 510, 520, 530, or 540), which may also include an avatar 510 of the user/player herself, as well as the gaming action events (e.g., 511, 521, 522, 531, or 541) within each of these captured training images may be labeled to form a training dataset for an image recognition model.

These labeled, captured training images may then be input into an image recognition model in order to train the model to accurately identify the avatars (e.g., 510, 520, 530, or 540) and actions (e.g., 511, 521, 522, 531, or 541) those avatars are taking within the captured training images. In some embodiments, the model may also be trained to identify a location (e.g., depth and orientation from the perspective of the player/user) within the virtual 3D gaming environment 500 displayed by a video display device within the information handling system executing the gaming system. The image recognition model may be trained repeatedly on a plurality of such training datasets until the model can accurately make such identifications within a preset tolerance (e.g., 70% of the time or greater).

Once the model is trained in such embodiments, captured images of live gameplay (e.g., images that have not yet been labeled to identify avatars or gaming action events) may by input into the trained image recognition model, which may then identify an avatar (e.g., 510, 520, 530, or 540), avatar location, and gaming action events (e.g., 511, 521, 522, 531, or 541) occurring within live gameplay as it is displayed via the video display. If the identified gaming action event (e.g., 511, 521, 522, 531, or 541) is associated with a haptic response (e.g., vibration, click, or bump of a portion of the palm rest), the 3D haptic keyboard and palm rest experience system may transmit a haptic command to a keyboard controller of the information handling system to initiate haptic movement of a portion of the combination haptic keyboard and palm rest.

In another embodiment described herein, the 3D haptic keyboard and palm rest experience system may identify such live gameplay gaming action events (e.g., 511, 521, 522, 531, or 541) by analyzing shifts in pixel brightness detected by firmware for the video display device. In many gaming scenarios, damage to the player avatar or a non-player game character avatar (e.g., enemy or ally) may be accompanied by a bright occurrence (e.g., 511, 521, 522, 531, or 541) such as a weapon firing or an explosion occurring. Firmware for the video display device in an embodiment may measure these changes in brightness, their size, location, and speed in real-time during live gameplay. Such firmware real-time analysis methods exist in the art in order to record the lag between a player inputting a user instruction (e.g., fire weapon) and display of the player avatar 510 taking the action 511 pursuant to such received user instruction, for example. The 3D haptic keyboard and palm rest experience system in an embodiment may access these real-time pixel brightness measurements in some embodiments described herein to determine when a gaming action event has occurred (e.g., an avatar 510 firing a weapon 511, performing another type of attack, taking damage), and the location (e.g., depth and angle with respect to the player) of the gaming action event (e.g., 511) as the gaming action event occurs during live gameplay. In some embodiments, the 3D haptic keyboard and palm rest experience system may further determine whether the avatar is the player avatar (e.g., 510) or a non-player avatar (e.g., 520, 530, or 540). If the identified gaming action event (e.g., player avatar 510 firing a weapon 511) is associated with a haptic response (e.g., vibration, click, or bump of one or more haptic regions of the combination haptic keyboard and palm rest assembly), the 3D haptic keyboard and palm rest experience system may transmit a haptic command to a keyboard controller of the information handling system to initiate haptic movement of a haptic region of the combination haptic keyboard and palm rest assembly.

The haptic command transmitted by the 3D haptic keyboard and palm rest experience system to the keyboard controller of the information handling system in an embodiment may initiate haptic movement of a portion of the combination haptic keyboard and palm rest assembly having a position with respect to the user that correlates to the position of the gaming action event (e.g., 511, 521, 522, 531, or 541) with respect to the player's avatar within the virtual three-dimensional gaming environment 500. For example, the gaming action event 511, located in the bottom-right corner of the image of the virtual three-dimensional gaming environment 500 and indicating an event occurring very near or at the player's avatar 510 may be associated with a haptic movement within a haptic region toward the right of the palm rest, which is the portion of the combined haptic keyboard and palm rest assembly closest the user. As another example, the gaming action event 531, located in the top-center of the image of the virtual three-dimensional gaming environment 500 and indicating an event occurring relatively far away from the player's avatar 510 may be associated with a haptic movement of one or more function or number keys, which is the portion of the combined haptic keyboard and palm rest assembly furthest away from the user, situated near the center of the keyboard.

In some embodiments, the detected gaming action event may be associated with a plurality of haptic regions. For example, the ally attack gaming action event 541 in an embodiment may begin at the ally avatar 540, and move toward the enemy avatar 520. In such an example embodiment, the gaming action event 541 may be associated with a haptic movement that begins in a haptic region located to the left of the combined haptic keyboard and palm rest assembly (e.g., around the "caps lock" key), and proceeds across a plurality of keys in a straight line to the right side of the combined haptic keyboard and palm rest assembly (e.g., number pad). In such a way, the 3D haptic keyboard and palm rest experience system may cause haptic feedback in a location of the combined haptic keyboard and palm rest assembly that reflects the location of the gaming action event 540 within the virtual three-dimensional gaming environment 500.

Figure 6:
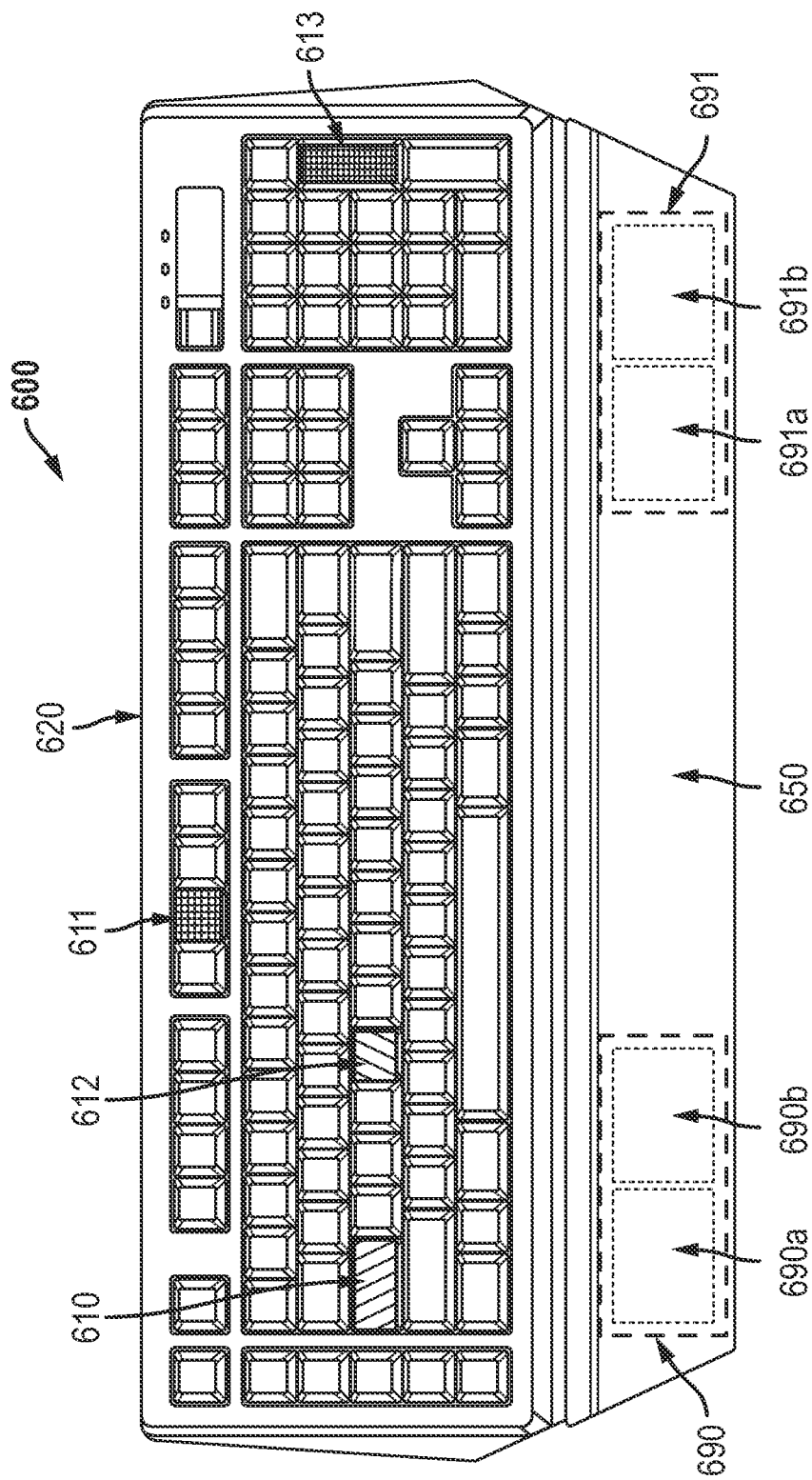
FIG. 6 is a top view of a combination haptic movement keyboard and palm rest assembly according to an embodiment of the present disclosure.

FIG. 6 is a top view of a combination haptic movement keyboard and palm rest assembly 600, including designated areas for haptic movement according to an embodiment of the present disclosure. As described herein, piezoelectric actuators situated within a combination keyboard and palm rest assembly 600 may provide haptic movement in various regions of the combination keyboard and palm rest assembly 600 in embodiments described herein. The haptic command transmitted by the 3D haptic keyboard and palm rest experience system to the keyboard controller of the information handling system in an embodiment may initiate haptic movement of a haptic region (e.g., key cap 610, key cap 611, key cap 612, palm rest zone 690 with one or more haptic regions, or palm rest zone 691 with one or more haptic zones) of the combination haptic keyboard and palm rest assembly 600 having a position with respect to the user that correlates to the position of the gaming action event with respect to the player's avatar within the virtual three-dimensional gaming environment. In some embodiments, haptic zone 690 may have a single piezo electric haptic actuator to form a single haptic region or may be split into two or more haptic regions (e.g., 690*a* and 690*b*) within haptic zone 690 with plural piezo electric actuators. Similarly, in some embodiments, haptic zone 691 may have a single piezo electric haptic actuator to form a single haptic region or may be split into two or more haptic regions (e.g., 691*a* and 691*b*) within haptic zone 691 with plural piezo electric actuators. For example, a gaming action event located in the bottom-right corner of an image of the virtual three-dimensional gaming environment and indicating an event occurring very near or at the player's avatar may be associated with a haptic movement within a haptic region 691 toward the right of the palm rest top cover 650, which is the portion of the combined haptic keyboard and palm rest assembly closest the user. In an example, haptic zone 691 may include only one haptic region and thus be a single haptic region 691. As another example, a gaming action event located in the top-center of an image of the virtual three-dimensional gaming environment and indicating an event occurring relatively far away from the player's avatar may be associated with a haptic movement of function key cap 611, which is the portion of the combined haptic keyboard and palm rest assembly furthest away from the user, situated near the center of the keyboard.

In some embodiments, the detected gaming action event may be associated with a plurality of haptic regions. For example, a gaming action event in an embodiment may begin toward the left-side of an image of three-dimensional game play and move toward the right side of the image. In such an example embodiment, the gaming action event may be associated with a haptic movement that begins in a haptic region at key cap 610 located to the left of the combined haptic keyboard and palm rest assembly (e.g., around the "caps lock" key), and proceeds across a plurality of keys in a straight line to the haptic region at key cap 613 of the combined haptic keyboard and palm rest assembly (e.g., number pad). In such a way, the 3D haptic keyboard and palm rest experience system may cause haptic feedback in a location of the combined haptic keyboard and palm rest assembly 600 that reflects the location of the gaming action event within the virtual three-dimensional gaming environment.

In some embodiments, the portion of the combination keyboard and palm rest assembly 600 (e.g., haptic region) that undergoes haptic movement in embodiments may depend upon the identified gaming action event, and the avatar taking such action or to which such action is applied. For example, the key (e.g., "F" key cap 612) on the keyboard that the player depresses in order to provide an instruction to fire a weapon may undergo haptic movement if the action identified in live gameplay is the player avatar firing a weapon. Such a haptic movement may indicate to the user that the weapon was fired, as instructed. In another example where each haptic zone 690 and 691 comprises its own haptic region, the left side palm rest haptic region 690 of the palm rest top cover 650 may undergo haptic movement if the action identified in live gameplay is the player avatar taking damage. In still another example, the right side palm rest haptic region 691 of the palm rest top cover 650 may undergo haptic movement if the action identified in live gameplay is a non-player game character avatar (e.g., enemy or adversary) taking damage. In other embodiments, users may assign various actions to specific portions of the combination keyboard and palm rest assembly 600. For example, the user may assign the user-avatar taking damage to the right side palm rest haptic region 691, rather than a default left side palm rest haptic region 690.

In some embodiments, the portion of the combination keyboard and palm rest assembly 600 (e.g., haptic region) that undergoes haptic movement in embodiments may depend upon the identified gaming action event, and the avatar taking such action or to which such action is applied and may include more haptic regions 690*a*, 690*b*, 691*a*, 691*b*, and haptic regions at keys such as 610, 611, 612, and 613 among other keys. For example, the key (e.g., "F" key cap 612) on the keyboard that the player depresses in order to provide an instruction to fire a weapon may undergo haptic movement if the action identified in live gameplay is the player avatar firing a weapon. Such a haptic movement may indicate to the user that the weapon was fired, as instructed. In another example where each haptic zone 690 and 691 comprises its plural haptic regions 690*a*, 690*b* and 691*a*, 691*b* for each hand, the left side palm rest haptic region 690*a* of left hand haptic zone 690 of the palm rest top cover 650 may undergo haptic movement if the action identified in live gameplay is the player avatar taking damage. In still another example, the right side palm rest haptic region 690*b* of left hand haptic zone 690 of the palm rest top cover 650 may undergo haptic movement if the action identified in live gameplay is a non-player game character avatar (e.g., enemy or adversary) taking damage. It is understood that such plural haptic regions of the haptic palm rest such as 690*a*, 690*b*, 691*a*, 691*b* may be used to impart virtual 3D gaming location of gaming action events to either the right or left hand of a user as well as movement across a virtual 3D gaming image of gaming action events between the haptic regions as described. Further, the haptic regions of haptic keys 610, 611, 612, and 613 or other keys may provide for further haptic feedback rendering to be provided to a user by the combination haptic keyboard and palm rest assembly 600 of embodiments herein. In other embodiments, users may assign various actions to specific portions of the combination keyboard and palm rest assembly 600. For example, the user may assign the user-avatar taking damage to the right side palm rest haptic region 691*a* of right hand haptic zone 691, rather than to the left side palm rest haptic zone 690 or any other combination of rendered haptic feedback across the combination haptic keyboard and palm rest assembly 600 haptic regions on the palm rest cover 650 or keys of the keyboard.

Figure 7:
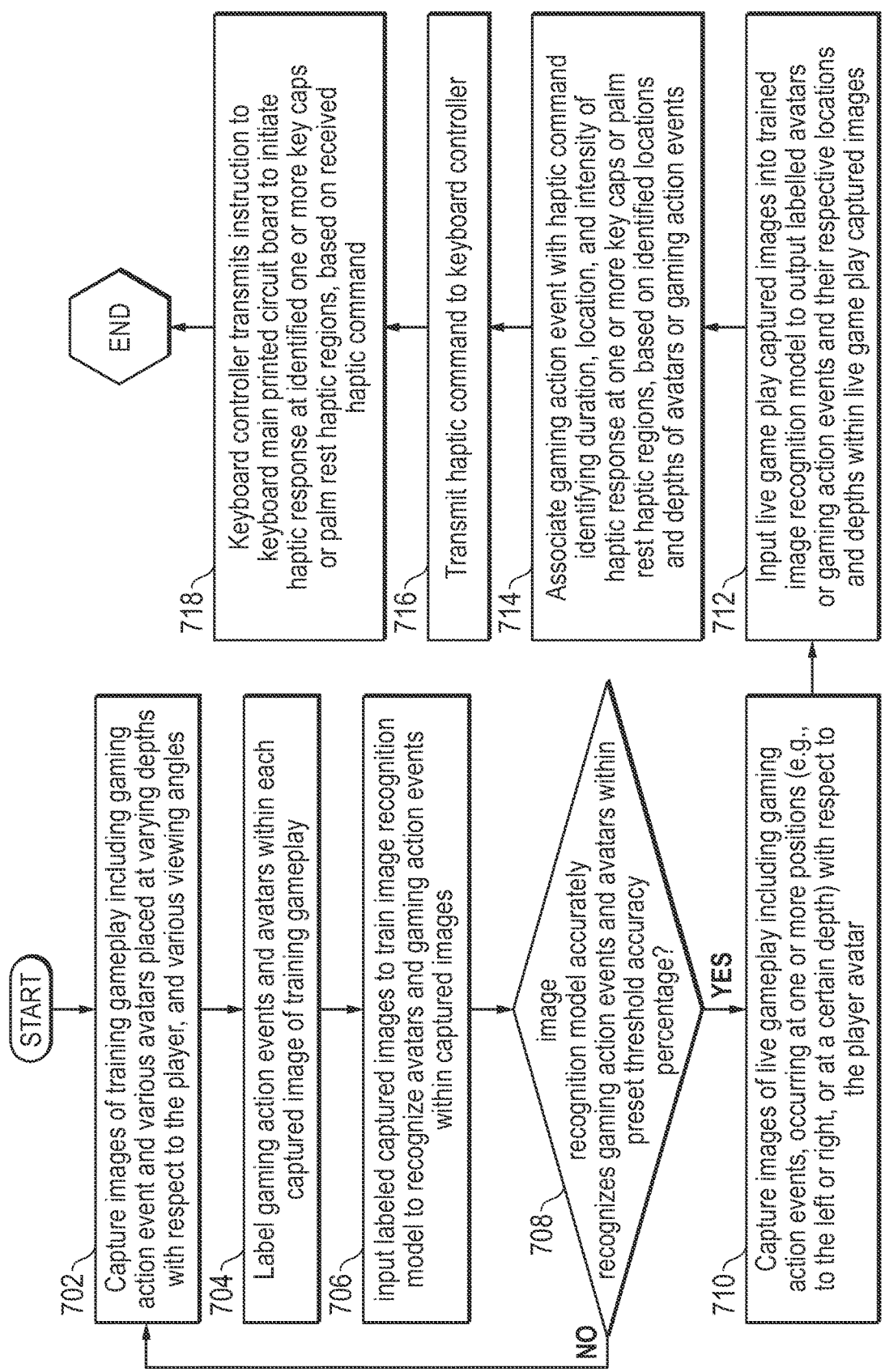
FIG. 7 is a flow diagram illustrating a method of training an image recognition model to identify gaming actions in live gameplay according to an embodiment of the present disclosure.

FIG. 7 is a flow diagram illustrating a method of training an image recognition model to identify gaming action events in live gameplay and generating haptic commands based on such identified gaming action events according to an embodiment of the present disclosure. As described herein, the 3D haptic keyboard and palm rest experience system in an embodiment may identify live gameplay gaming action events warranting haptic movement of a portion of the combination haptic keyboard and palm rest assembly using a plurality of different methods, including, for example, a trained image recognition model.

At block 702, the 3D haptic keyboard and palm rest experience system in an embodiment may capture images of training gameplay including gaming action events and various avatars placed at varying depths with respect to the player avatar, and various viewing angles. For example, in an embodiment described with reference to FIG. 5, the 3D haptic keyboard and palm rest experience system may capture images displayed within the virtual three-dimensional gaming environment 500. Captured images in an embodiment may comprise a flattened or two-dimensional image or view of three-dimensional game play. These captured images of training gameplay may include one or more avatars, such as for example, player avatar 510, ally avatar 540, enemy avatar 520, or enemy avatar 530. One or more gaming action events such as the player attack gaming action event 511, the enemy attack gaming action event 521, the enemy damage gaming action event 522, the enemy attack gaming action event 531, or the ally attack gaming action event 541 may also be included within the captured images of training gameplay. Further, the avatars and gaming action events may take place in different locations with respect to the player avatar 510 within the virtual three-dimensional gaming environment 500, and may thus be viewed from various angles. For example, the enemy avatar 520 and enemy avatar 530 may have different locations with respect to the player avatar 510 (e.g., enemy avatar 520 being located much closer to the player avatar 510 than enemy avatar 530), thus causing the player avatar 510 to view each of the enemy avatars (e.g., 520 and 530 from different angles).

In some circumstances, captured images of training gameplay may also include images of the avatars or actions events from various angles. For example, one captured image may include the player avatar 510 viewing the right-side of the ally avatar 540, as the ally avatar 540 fires from the left peripheral vision of the player avatar 510 toward the enemy avatar 520 within the right peripheral vision of the player avatar 510. As another example, a second captured image may include the player avatar 510 viewing the back of the ally avatar 540, as the ally avatar 540 fires from a position relatively closer to the player avatar 510 toward the enemy avatar 530 located relatively farther away from the player avatar 510.

The captured image in an embodiment may be described on a pixel by pixel basis, with each of the pixels in an image being associated with a value between 0 and 255, for example. In other embodiments, particularly with respect to high-definition images, the pixel values may adhere to a larger scale representative of a greater degree of granularity between pixel colors and brightness. A single captured image in an embodiment may thus be represented by a two-dimensional array, with one column identifying a pixel location within the captured image, and another column identifying the color value (e.g., between 0 and 255 for a typical 8-bit red/green/blue (RGB) image) of that pixel.

The 3D haptic keyboard and palm rest experience system in an embodiment may label gaming action events and avatars within each of the captured images of the training gameplay at block 704. For example, the 3D haptic keyboard and palm rest experience system in an embodiment may label the player avatar 510, ally avatar 540, enemy avatar 520, or enemy avatar 530 displayed within captured images of the virtual three-dimensional gaming environment 500. One or more gaming action events such as the player attack gaming action event 511, the enemy attack gaming action event 521, the enemy damage gaming action event 522, the enemy attack gaming action event 531, or the ally attack gaming action event 541 may also be labeled.

As described directly above, the labeled captured images may display each of the avatars and gaming action events from a plurality of angles. These labeled and captured images may form a set of images used to train an image recognition model, for rendering haptic feedback across a haptic keyboard and haptic palm rest, as described herein. The labels in an embodiment may be used to compare against attempts by an untrained image recognition model to identify avatars and gaming action events during training sessions for the image recognition model and association with haptic feedback types, location, duration, intensity, or movement pattern, as described in greater detail directly below. By training the image recognition model on labeled captured images that show each of the avatars and gaming action events from various angles may allow the image recognition model to later recognize these avatars and gaming action events regardless of the position or angle with respect to the player avatar at which they occur within the virtual three-dimensional gaming environment.

At block 706, the 3D haptic keyboard and palm rest experience system may input the labeled, captured images to train an image recognition model to recognize avatars and gaming action events within the captured events of training gameplay. The image recognition model in an embodiment may comprise a feed-forward convolution neural network (CNN) having multiple layers, including an input layer, one or more hidden layers, and an output layer. In some embodiments, a single image recognition model (e.g., single CNN) may be trained to identify a plurality of features (e.g., objects, avatars, gaming action events) within a single captured image. In other embodiments, separate image recognition models may be developed, with each image recognition model operating as a classifier to detect whether an image includes only one identified feature (e.g., a class of gaming action events of class of associated location or types of haptic tactile feedback to be rendered on a haptic keyboard or haptic palm rest region). For example, one image recognition model may operate to identify images in which a player attack gaming action event (e.g., 511) is displayed, while another image recognition model operates to identify images in which an ally attack gaming action event (e.g., 541) is displayed.

Various pre-processing steps may be applied to the image captured at block 702 in order to convert it into an input understood by a feed-forward neural network. For example, a convolutional method may be applied to the captured image, as well as linear rectification or pooling methods in some embodiments. Such pre-processing may begin with a two-dimensional array of values describing the pixel values representing one or more images captured at block 702. Each of these pixels may be grouped into a matrix of a preset size (e.g., 3×3 pixels). A convolution step in an embodiment may involve mathematical convolution of two of such matrices that overlap one another (e.g., share a row or column of pixels with one another).

Conventional convolutions methods known in the art may be used to perform this step. For example, the Python programming language provides functionality for applying a user-defined convolution operation to pixel values within a two-dimensional array. Such a convolution method may produce a feature map of the two-dimensional image of the virtual three-dimensional gaming environment (e.g., 500) captured at block 702 and labeled at block 704. The convolution applied may be defined by the user by selecting one or more types of filters that operate to weight the pixel values (e.g., between 0 and 255) in various ways prior to matrix multiplication. The type of filters chosen and applied by the user in such a way may alter the pixel values of the captured image in order to make image detection easier. For example, filters may sharpen or focus the image, blur the image, or enhance edges of objects, avatars, or gaming action events displayed within a captured image.

Convolutional methods in an embodiment may be followed by a pooling step, or in some embodiments, by a rectified linear unit activation function (ReLU) step between the convolutional and pooling. The ReLU step may apply a rectified linear unit activation function to the product of the convolution step in an embodiment in order to overcome the vanishing gradient problem endemic to many image recognition models, allowing models to learn faster and perform better. Various models are contemplated.

A pooling step in an embodiment may operate to reduce the size of the feature map, increase computational speed, and avoid overfitting. Pooling in an embodiment involves separating the captured image forming the basis of the input layer into non-overlapping and uniform blocks of pixels, and discarding all but the maximum value across all of the pixels within that block (e.g., node value for the brightest pixel within that block). This greatly reduces the size of the feature map, and increases the computational speed of the image recognition model. Various pooling functions exist in the art, including maximum pooling (e.g., as described directly above), average pooling (taking the average of all pixel values within a pixel block), and sum pooling (adding together each of the pixel values for the pixels within the block). Regardless of the pooling function applied, the pooling layer may reduce the size of information used by the image recognition model to analyze the captured image. The pooling step may be skipped in some embodiments, especially as computational resources increase, or as convolutional methods evolve to produce smaller feature maps.

The feature map resulting from such a convolution (and optionally by additional linear rectification or pooling) may be flattened into a single vector forming the first of a plurality of fully-connected layers of a feed-forward neural network. Each of the values within this single vector may constitute a value of a node within the input layer of the neural network. As described above, the neural network in an embodiment may operate to identify whether an image includes one or more specific features (e.g., avatar, gaming action event, object). A neural network operating to determine whether a single identified feature (e.g., enemy avatar, player initiated attack gaming action event, enemy avatar taking damage gaming action event) is displayed within an image in an embodiment may include a first hidden layer following the input layer, where each of the nodes of the first hidden layer provides a best guess (0 for no, and 1 for yes, for example) as to whether the image includes the specifically identified feature. The neural network of the image recognition model may be modeled using any number of layers, and the nodes in each additional layer may be determined based on the value of the nodes in the previous layer and the weight matrices describing correlations between each of the values within the flattened feature map and identified features. In other words, each new layer in the neural network may include a plurality of nodes, with each representing a best guess of whether a value within the flattened feature map is associated with a the specifically identified feature within the image of the virtual three-dimensional gaming environment captured at block 702.

A greater number of layers within the neural network topology may decrease the likelihood of divergence (yielding unusable results), but may increase processing time. The neural network of the image recognition model may then produce an output layer including a plurality of nodes, each representing a best guess (either 0 or 1) indicating the presence of the specifically identified feature (e.g., enemy avatar or specific gaming action event) within the image captured at block 702, labeled at block 704, and input into the untrained model at block 706 during a training session. Each of the node values within the output layer in an embodiment (e.g., each represented by a binary 0 or 1) may be averaged to produce a percentage likelihood (e.g., value between 0 and 1) that the input training image depicts the specific feature the model is being trained to identify or classify. The process of generating an output layer, based on a known set of input layer values may be described herein as forward propagation.

The 3D haptic keyboard and palm rest experience system in an embodiment may compare the percentage likelihood (e.g., value between 0 and 1), taken as an average across the node values of the output layer, to a known value indicating whether the image input into the model at block 706 does (e.g., represented by the value 1) or does not (e.g., represented by the value 0) include the specific feature the model is training to recognize, based on the labeling of the image at block 704. The difference between the percentage likelihood and the known value in such an embodiment may be referred to herein as the error signal for this initial forward propagation. For example, an initial forward propagation of the image recognition model during a training session in an embodiment may produce an output layer averaging 0.76 likelihood that the image captured at block 702 includes a player attack gaming action event 511. The image captured at block 702 in such an embodiment may have been associated with a value of one at block 704, indicating the captured image does include the player attack gaming action event 511. In such an embodiment, the error function for the initial forward propagation may be 0.24. Each forward propagation occurring during such a training session may produce a separate error signal in an embodiment as the training session progresses, as described in greater detail below.

The 3D haptic keyboard and palm rest experience system may then use this known error function to adjust weight matrices associated with each layer of the modeled neural network that describe the interrelationship between each of the nodes within the input layer, hidden layers, and output layer. For example, the 3D haptic keyboard and palm rest experience system may perform a back-propagation method to adjust each of the weight matrices in order to more accurately reflect the correlations between each of the values within the feature map represented within the input layer and a likelihood that such a value indicates the presence of the feature (e.g., player attack gaming action event 511) the model is training to recognize. The 3D haptic keyboard and palm rest experience system may then forward propagate the same input node values used in the first forward propagation through each of the weight-adjusted hidden layers to produce a new output layer and a new error signal. The 3D haptic keyboard and palm rest experience system may repeatedly perform this forward propagation and back propagation until the output layer produces a likelihood that the image contains the feature the model is training to recognize that matches the known value (e.g., as applied during labeling of the image at block 704). For example, if the image is known to contain the feature (e.g., player attack gaming action event 511) the model is training to detect, the image may be associated with a value of one, and the 3D haptic keyboard and palm rest experience system may perform the forward and back propagation method until the model outputs nodes having an average value sufficiently close to the value of one that the model may be considered as accurately recognizing the feature or absence thereof within the image. The average output node value may be sufficiently close to the known value of one if it meets a preset threshold value (e.g., 99%, 99.9%, etc.) in an embodiment. In other words, the model may be said to accurately recognize the feature (e.g., player attack gaming action event 511) or absence thereof within a single training image if it can recognize the feature or lack thereof within the single image with an accuracy of 99%, for example.

The 3D haptic keyboard and palm rest experience system in an embodiment may determine at block 708 whether the image recognition model can accurately recognize gaming action events and avatars across a plurality of captured images within a preset threshold accuracy percentage. The 3D haptic keyboard and palm rest experience system in an embodiment may repeatedly perform the forward propagation and backward propagation described with respect to block 706, using different input node values, to finely tune the weight matrices of the image recognition model. In other words, the image recognition model may be trained on a plurality of different captured images, each depicting (or not depicting) the specifically identified feature (e.g., player attack gaming action event 511) at various locations within the image, or as seen from various angles.

The image recognition model in an embodiment may be considered fully trained at block 708 to identify a given feature (e.g., player attack gaming action event 511) when the image recognition model accurately identifies the feature or lack thereof, as described directly above with respect to block 706 within a preset threshold percentage of the captured images forming the training set. For example, the preset threshold accuracy percentage in an embodiment may set to 70% in an embodiment in which the training set contains 100 captured and labeled images. In such an embodiment, the 3D haptic keyboard and palm rest experience system may determine at block 708 whether the image recognition model can accurately identify the feature for which it is trained, or lack thereof, in 70 of the 100 captured and labeled images comprising the training set. This is only an example threshold accuracy percentage value and is meant to be illustrative rather than limiting. Other embodiments may require higher (e.g., 90%, 95%, etc.) or lower (e.g., 65%, 60%, etc.) preset threshold accuracy percentage values. If the image recognition model can accurately recognize gaming action events and avatars within tolerances at block 708, the method may proceed to block 710 for application of the trained image recognition model to live gameplay images for identification of live gaming action events. If the image recognition model cannot accurately recognize gaming action events and avatars within tolerances at block 708, the method may proceed back to block 702 to further train the image recognition model on additional training gameplay images with modified weighting, etc.

At block 710 in an embodiment in which the image recognition model has been sufficiently trained, the 3D haptic keyboard and palm rest experience system in an embodiment may capture an image of live gameplay, in real-time, that has not yet been labeled. A live gameplay image in an embodiment may depict a plurality of avatars or a plurality of gaming action events, each located at various positions with respect to the player avatar. The live gameplay image in an embodiment may be described by a two-dimensional array of pixel values, similar to the captured images within the training set. Additionally, the live gameplay image may undergo the pre-processing convolutional, ReLU, pooling, or flattening steps described above with respect to the captured images within the training set to produce a flattened feature map for the live gameplay image. This step may occur repeatedly and in real-time in order to detect the occurrence of specific features (e.g., gaming action events), as they occur during gameplay.

The 3D haptic keyboard and palm rest experience system in an embodiment may input the captured image of live gameplay into the trained image recognition model or trained inference model at block 712. The flattened feature map of the live gameplay image may be input into the image recognition model in such an embodiment. The image recognition model may then output a percentage likelihood that the live gameplay image includes the feature (e.g., player attack gaming action event 511) the image recognition model has been trained to detect or recognize. If the percentage likelihood that the live gameplay image includes the feature meets a preset threshold detection value (e.g., 90%, 95%, etc.), the 3D haptic keyboard and palm rest system may determine that a specific gaming action event (e.g., player attack gaming action event) has occurred.

In some embodiments, portions of a single captured image of live gameplay may be input into the trained model, serially, in order to determine whether the feature the model is trained to detect is being displayed within a specific portion of the whole image. The 3D haptic keyboard and palm rest experience system in an embodiment may perform such a segmentation in order to identify which portion of the virtual 3D gaming environment 500 in which a particular gaming action event occurs during live gameplay. For example, the captured image may depict the player avatar's view of the entire virtual 3D gaming environment 500 in an embodiment. In some embodiments, such a captured image may be segmented into a plurality of smaller images, each representing a zone or quadrant within the full captured image. More specifically, the full captured image may be segmented into four separate images, including an upper right portion, an upper left portion, a lower left portion, and a lower right portion. This is only one example of such a segmentation, and it is contemplated segmentation into a greater number of zones or portions may be employed. Increasing the number of segmentation zones in an embodiment may increase the granularity of gaming action event location determination, but may also increase computational resources required to perform such a determination.

Following such a segmentation in such an embodiment, the segmented images (e.g., four separate segmented images in the example described directly above) may each be pre-processed, and their flattened feature maps may be input into the image recognition model to determine whether a specific gaming action event has occurred within a specific segmented zone or portion of the full image. The image recognition model(s) in such an embodiment may then provide an output indicating whether a specific gaming action event (e.g., player attack 511) has occurred within a specific segmented zone or portion of the player avatar's view of the virtual 3D gaming environment (e.g., 500). This may provide a rough orientation of the gaming action event with respect to the player avatar (e.g., to the left for the left two quadrants, or farther away for the top two quadrants). In such a way, the 3D haptic keyboard and palm rest experience system in an embodiment may gauge the location of an identified gaming action event within a captured image of live gameplay.

The image of live gameplay captured at block 710 may be input into a plurality of image recognition models in some embodiments, with each model trained to detect a different feature. In such an embodiment, each of the plurality of image recognition models may be trained to one of a plurality of gaming action events the 3D haptic keyboard and palm rest experience system associates with a specific type of haptic feedback. For example, a first image recognition model may be trained to identify a player attack gaming action event (e.g., 511), a second image recognition model may be trained to identify an enemy attack gaming action event (e.g., 521 or 531), a third image recognition model may be trained to identify an enemy damage gaming action event (e.g., 522), and a fourth image recognition model may be trained to identify an ally attack gaming action event (e.g., 541). In other embodiments, a single image recognition model may be trained to identify each of these gaming action events or features. Regardless of the specific embodiment employed herein, the 3D haptic keyboard and palm rest experience system in an embodiment may operate at block 712 to identify the occurrence or lack thereof of a plurality of gaming action events associated with haptic feedback within a single captured image of live gameplay. Blocks 710 and 712 may be repeated continuously throughout such live gameplay in an embodiment in order for the 3D haptic keyboard and palm rest experience system to detect gaming action events associated with haptic feedback in real-time, as they occur during live gameplay.

At block 714, the 3D haptic keyboard and palm rest experience system may associate a gaming action event identified by the trained image recognition model occurring at an identified location with respect to the player's avatar within the captured image with a haptic command in an embodiment. Such a haptic command may identify a duration, intensity, and location within the combination haptic keyboard and palm rest of haptic movement representative of the identified gaming action event, based on the identified location of the gaming action event, or avatars involved therewith. Upon detection of a specific gaming action event within a captured image of live gameplay, or a segmented portion thereof, the 3D haptic keyboard and palm rest system in an embodiment may associate the identified gaming action event with a haptic response, based on a stored association between known gaming action events and preset haptic responses. For example, the 3D haptic keyboard and palm rest experience system may associate certain gaming action events with specifically identified keys of the keyboard. More specifically, the 3D haptic keyboard and palm rest experience system may associate the player avatar attack gaming action event with the "F" key the user depresses in order to instruct the player avatar to fire a weapon. In an embodiment in which the image recognition model determines the player avatar attack action (e.g., 511) has occurred within live gameplay, the 3D haptic keyboard and palm rest experience system may associate this determination with a haptic command to initiate haptic movement at the "F" key.

As another example, the 3D haptic keyboard and palm rest experience system may associate certain gaming action events of a specific avatar with a specific haptic region of the keyboard or palm rest assembly. More specifically, the 3D haptic keyboard and palm rest experience system may associate the enemy avatar damage gaming action event (e.g., 522) with a haptic response in the right-side region (relative to one or both palms of a user) of the palm rest and may associate the player avatar taking damage with a haptic response the left-side region (relative to one or both palms of a user) of the palm rest. In an embodiment in which the image recognition model determines the enemy avatar damage gaming action event (e.g., 522) has occurred within live gameplay, the 3D haptic keyboard and palm rest experience system may associate this determination with a haptic command to initiate haptic movement within the right-side region of the palm rest.

In yet another example, the 3D haptic keyboard and palm rest experience system may associate the location of gaming action events within the virtual 3D gaming environment (e.g., 500) with specifically identified haptic regions of the combined haptic keyboard and palm rest assembly. More specifically, as described herein, the 3D haptic keyboard and palm rest experience system may determine a rough orientation or location of a gaming action event with respect to the player avatar in an embodiment by segmented a captured image of live gameplay into a plurality of zones, and analyzing each segmented image for presence of the gaming action event separately. As the number of segments used increases, so too does the granularity of the determination of gaming action event location within the virtual 3D gaming environment (e.g., 500) with respect to the player avatar (e.g., 510). The number of segments used in an embodiment may correlate to a number of haptic regions defined within the combination haptic keyboard and palm rest assembly for rendering haptic feedback to a user. For example, the 3D haptic keyboard and palm rest experience system may associate keys at a top-left quadrant of the combination haptic keyboard and palm rest assembly relative to a user's hand with gaming action events detected within the top-left quadrant segment of a captured image of live gameplay within the virtual 3D gaming environment 500. In such an embodiment, the 3D haptic keyboard and palm rest experience system may detect occurrence of the enemy attack gaming action event 531 within the top-left quadrant segment of the captured image of live gameplay depicted at FIG. 5, and associate this enemy attack gaming action event 531 with a haptic response within the top-left keys of the combination haptic keyboard and palm rest assembly being accessed by a user. In some embodiments, the 3D haptic keyboard and palm rest experience system will have data indicating action input keys for a gaming application and those keys may form some of the haptic regions with which haptic feedback may be provided to a user. In other embodiments, the 3D haptic keyboard and palm rest experience system may determine only one hand is used during gaming on a keyboard for gaming input commands while another hand may be used with a mouse, joystick or other input/output device. In such embodiments, the 3D haptic keyboard and palm rest experience system may provide haptic feedback to palm rest haptic regions for the user's hand to be engaged with the keyboard. In such a way, the 3D haptic keyboard and palm rest experience system in an embodiment may render the location of a haptic response with respect to the user of the combination haptic keyboard and palm rest assembly to the location of a gaming action event (e.g., 531) occurring with respect to the player avatar (e.g., 510) in the virtual three-dimensional gaming environment (e.g., 500).

In still another example, the 3D haptic keyboard and palm rest experience system may associate a single gaming action event with a plurality of keys or haptic regions of the keyboard or palm rest assembly. As described herein, some gaming action events in an embodiment may move from one portion of the virtual 3D gaming environment to another. For example, the ally avatar 540 may perform an ally attack gaming action event 541 on the enemy avatar 520 that begins at the ally avatar 540 and progressively moves across the displayed image (here, to the right) to the enemy avatar 520. In such an embodiment, this movement may be depicted through a plurality of captured images. The 3D haptic keyboard and palm rest experience system may identify such an ally attack gaming action event 541 location changing in each of these progressively captured images. Because each identified gaming action event (e.g., 541) in these successive images occur at a different location, they may each be associated with a haptic response in a separate haptic region of the combination haptic keyboard and palm rest assembly.

The 3D haptic keyboard and palm rest experience system in an embodiment may also associate the identified gaming action event (or its location in some embodiments) with a specific intensity or pulse pattern of the haptic response. For example, gaming action events that incorporate the player avatar (e.g., the player avatar firing a weapon or taking damage) may be associated with a greater intensity of haptic response tha gaming action events not involving the player avatar (e.g., enemy avatar taking damage, ally avatar firing on enemy avatar, or ally avatar taking damage). As another example, the firing of different weapons by the player avatar may be associated with different haptic response pulse patterns (e.g., rapid vibration or clicks vs. slower vibration or clicks).

The 3D haptic keyboard and palm rest experience system in an embodiment may transmit the haptic command to the keyboard controller at block 716. For example, in an embodiment described with reference to FIG. 1, the 3D haptic keyboard and palm rest experience system may be operably connected to the keyboard controller 130. In some embodiments, a haptic controller or controller on the keyboard or palm rest may be operably connected to the 3D haptic keyboard and palm rest experience system. The 3D haptic keyboard and palm rest experience system in such an embodiment may transmit a haptic command identifying a haptic region (e.g., including one or more keys, the palm rest, or portions thereof) in which to initiate a haptic response. The haptic command in such an embodiment may further identify an intensity and pulse pattern in which to apply the haptic response. The intensity in an embodiment may take the form of a specific electrical charge value (e.g., voltage magnitude), or a percentage of the highest voltage that can be applied to piezoelectric actuators within a given haptic region. The pulse pattern in an embodiment may be identified by selection from a preset list of available waveforms of step functions pre-programmed into the keyboard controller 130 or other haptic controllers, for example.

At block 718, the keyboard controller may transmit an instruction to the keyboard main printed circuit board to initiate the haptic response at the location within the combination haptic keyboard and palm rest identified within the haptic command. In some embodiments, this step may involve an instruction to apply the identified voltage magnitude according to the identified wave form or step function described directly above to a piezoelectric actuator operably connected to the keyboard main printed circuit board assembly. In other embodiments, this step may involve an instruction to command another printed circuit board operably connected to the keyboard main printed circuit board to apply the identified voltage magnitude according to the identified wave form or step function to a piezoelectric actuator operably connected thereto. In such a way, the 3D haptic keyboard and palm rest experience system in an embodiment may detect gaming action events associated with haptic responses as they occur during live gameplay, and instruct a keyboard controller to initiate a haptic response indicative of the gaming action event at a piezoelectric actuator whose location with respect to the user reflects the location of the gaming action event with respect to the player's avatar. The method of generating haptic commands based on gaming action events identified using a trained image recognition model may then end.

Figure 8:
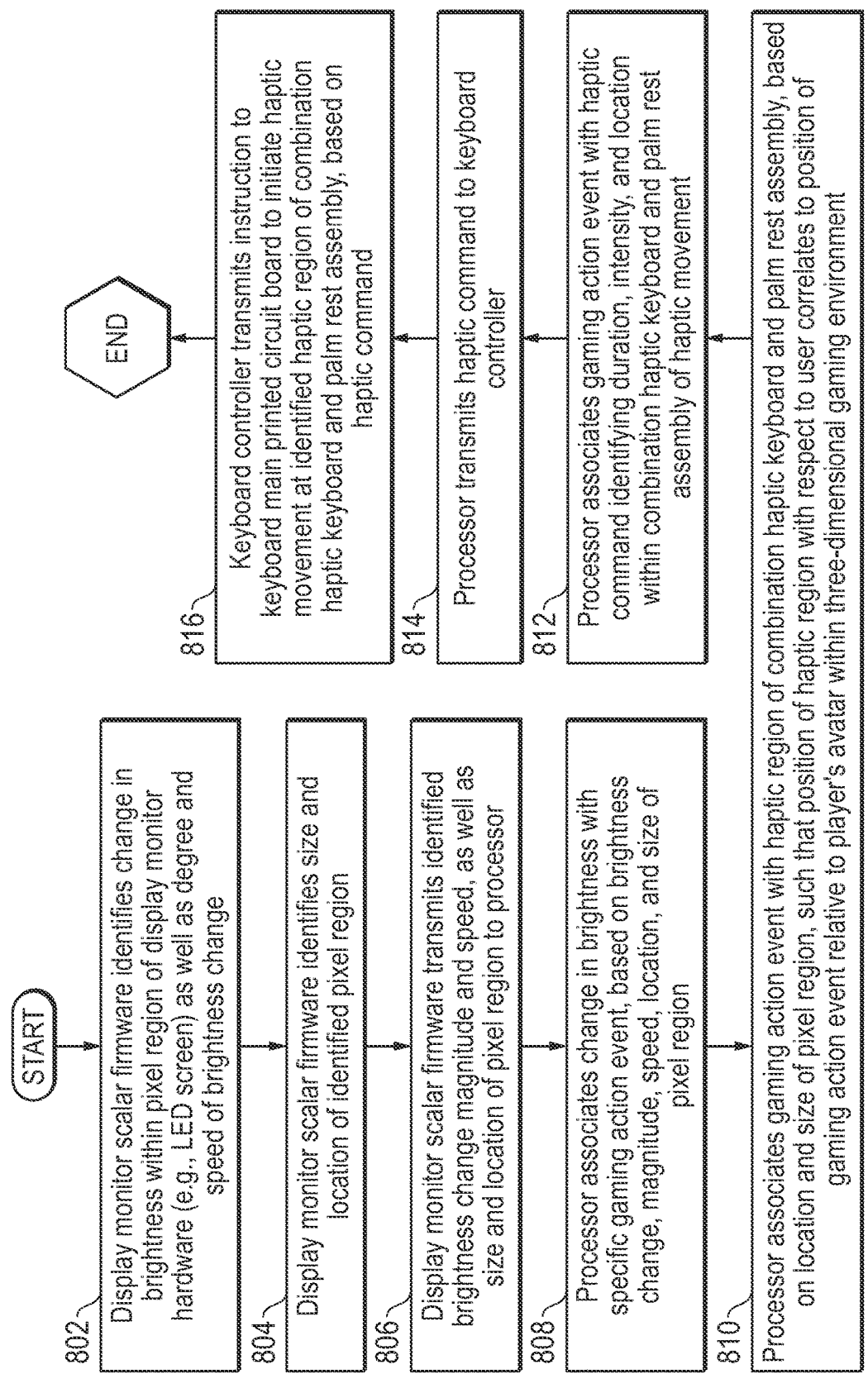
FIG. 8 is a flow diagram illustrating a method of detecting gaming action events based on changes in display device pixel brightness according to an embodiment of the present disclosure.

FIG. 8 is a flow diagram illustrating a method of detecting gaming action events based on changes in display device pixel brightness and generating haptic commands based on such identified gaming action events according to an embodiment of the present disclosure. As described herein, the 3D haptic keyboard and palm rest experience system may identify live gameplay gaming action events associated with haptic movement within the combination haptic keyboard and palm rest assembly by analyzing shifts in pixel brightness detected by firmware for the video display device.

At block 802, the display monitor scalar firmware may identify a change in brightness within a pixel region of the display monitor hardware, as well as a degree and speed of such a brightness change in an embodiment. The display firmware in an embodiment may operate, at least in part, to measure changes in pixel brightness over time, during live gameplay displayed via the video display. Changes in pixel brightness in an embodiment may indicate occurrence of a gaming action event in some circumstances. The size, position, and magnitude of such changes in pixel brightness may indicate the type of gaming action event and its location with respect to the player avatar in an embodiment, as described in greater detail below with respect to block 808.

The display monitor scalar firmware in an embodiment may identify the size and location of the identified pixel region at block 804. For example, the display monitor scalar firmware in an embodiment may be capable of accessing or generating the two-dimensional array of pixel values, described with reference to FIG. 7, that associates each of the pixels in the display with a specific brightness value (e.g., between zero and 255 for 8-bit RGB color) at which it emits light to generate a single image of live gameplay. Each frame of live gameplay may be associated with a different two-dimensional pixel brightness array in an embodiment. The display monitor scalar firmware in an embodiment may compare a plurality of these two-dimensional pixel brightness arrays against one another in order to identify one or more pixels that underwent or are undergoing a change in pixel brightness value meeting a threshold value (e.g., a change of 100 or more). In such an embodiment, the display monitor scalar firmware may determine the size of a brightness change by determining the number of pixels so identified that are situated next to one another, for example. In another example embodiment, the display monitor scalar firmware may perform a method similar to the pooling method (e.g., maximum, average, or summation) described above with respect to block 706 in FIG. 7 to group pixels according to changes in brightness.

Once one or more pixels are identified in such a way, the location of the pixels within the display may be determined by referencing the identification number of the pixel given within the two-dimensional array of pixel brightness values. Each pixel within a video display may be assigned a number based on its position within the display in an embodiment. For example, the top-left most pixel within a standard full high-definition 1080p computer video display that includes 2,073,600 pixels may be given an identifying number of 0000001, while the bottom-right most pixel may be given an identifying number of 2073600.

In some embodiments, the display monitor scalar firmware may associate this identifying number with a specific portion or zone of the displayed image. For example, the display monitor scalar firmware in an embodiment may divide the display view into four separate quadrants, with all pixels associated with only one of the four quadrants. In such an embodiment, the quadrant associated with the pixel may comprise the determined location of the pixel. In other embodiments, the display may be segmented into several portions, such as described with reference to block 710 in FIG. 7. This may provide greater granularity in the determination of location of a change in pixel brightness, and consequently, the determination of location of a gaming action event occurring within live gameplay. In still other embodiments, the location determined by the display monitor firmware may comprise the identifying number of the pixel or pixels undergoing the detected change in brightness, and association of the identifying pixel number or numbers may be performed by the 3D haptic keyboard and palm rest experience system instead.

At block 806, the display monitor scalar firmware may transmit an identified brightness change magnitude and speed, as well as a size and location of the pixel region to the processor. As described in an embodiment with respect to FIG. 1, the video display 110 that includes the display monitor scalar firmware may be operably connected to the 3D haptic keyboard and palm rest experience system 132 via one or more buses 108. The display monitor scalar firmware in such an embodiment may use bus 108 to transmit the determined size and location of the pixels undergoing the identified change in brightness to the 3D haptic keyboard and palm rest experience system 132. The display monitor scalar firmware may also transmit the magnitude of such change, as determined by comparing the values for a single pixel across multiple two-dimensional arrays (each representing a different frame of live game play) and the speed such change, as determined by dividing the magnitude by the number of frames so compared.

The 3D haptic keyboard and palm rest experience system executing at the processor may associate the change in brightness with the specific avatar gaming action event, based on the brightness change magnitude and speed and location and size of the pixel region at block 808. As described herein, changes in pixel brightness in an embodiment may indicate occurrence of a gaming action event in some circumstances. The size, position, and magnitude of such changes in pixel brightness may indicate the type of gaming action event and its location with respect to the player avatar in an embodiment. For example, in an embodiment described with reference to FIG. 5, the player attack gaming action event 511 may be displayed as a different color than the ally attack gaming action event 541, or than enemy avatar attack gaming action events 521 or 531. As another example, different weapons fired by the player avatar 510 in an embodiment may be associated with different colors, and thus, brightness values (e.g., a number between zero and 255 for 8-bit RGB color). In addition, certain weapons may be associated with longer duration firing bursts, resulting in slower changes in pixel brightness than a shot of a single bullet, for example, which may be rendered as a very quick flash of light.

The size of the change in pixel brightness, or the number of pixels undergoing such a change in brightness at any given instant in time may also be used to identify the gaming action event, or its location within the virtual three-dimensional gaming environment (e.g., 500). For example, gaming action events (e.g., enemy attack gaming action event 531) occurring farther away from the player avatar 510 than similar gaming action events (e.g., enemy attack gaming action event 521) may appear smaller in size by comparison. As another example, a damage caused by a grenade launcher may appear larger in size than damage caused by rifle fire.

The position of the pixels undergoing a change in brightness in an embodiment may further be used to identify the location of a gaming action event in an embodiment. For example, if the pixels undergoing brightness changes are within an upper portion of the video display in an embodiment, the change in brightness may be associated with a gaming action event occurring relatively farther away from the player avatar 510 tha gaming action events depicted by changes in brightness in pixels within a lower portion of the video display. This may be the case, in an embodiment, because objects (e.g., enemy avatar 520) within the virtual three-dimensional gaming environment 500 that are located closer to the player avatar 510 are depicted more toward the bottom of the screen than are objects (e.g., enemy avatar 530) located farther from the player avatar 510. In some embodiments, the determination of the gaming action event and its location may be determined based on a combination of these factors.

At block 810, the 3D haptic keyboard and palm rest experience system may associate the gaming action event with one or more haptic regions of the combination haptic keyboard and palm rest assembly, based on the location and size of the pixel region. In such an embodiment, the position of the haptic region of the combination haptic keyboard and palm rest assembly with respect to the user may correlate to the position of the gaming action event with respect to the player's avatar within the virtual three-dimensional gaming environment displayed via the display monitor. For example, the 3D haptic keyboard and palm rest experience system may render the location of gaming action events within the virtual 3D gaming environment (e.g., 500) with specifically identified haptic regions of the combined haptic keyboard and palm rest assembly. More specifically, as described herein, the 3D haptic keyboard and palm rest experience system may determine a rough orientation or location of a gaming action event with respect to the player avatar in an embodiment by identifying which segmented portion of the display in which the pixels associated with a change in brightness are situated. As the number of segments used increases, so too does the granularity of the determination of gaming action event location within the virtual 3D gaming environment (e.g., 500) with respect to the player avatar (e.g., 510).

The number of segments used in an embodiment may correlate to a number of haptic regions defined within the combination haptic keyboard and palm rest assembly. For example, the 3D haptic keyboard and palm rest experience system may associate keys falling within a top-left position relative to a user's hand on the combination haptic keyboard and palm rest assembly with gaming action events detected within the top-left quadrant of pixels within the display. In such an embodiment, the 3D haptic keyboard and palm rest experience system may detect occurrence of the enemy attack gaming action event 531 displayed within the top-left quadrant, and associate this enemy attack gaming action event 531 with a haptic response within the top-left position of the keys being actuated by a user's hand on the combination haptic keyboard and palm rest assembly. In such a way, the 3D haptic keyboard and palm rest experience system in an embodiment may correlate the location of a haptic response with respect to the user of the combination haptic keyboard and palm rest assembly to the location of a gaming action event (e.g., 531) occurring with respect to the player avatar (e.g., 510) in the virtual three-dimensional gaming environment (e.g., 500).

The 3D haptic keyboard and palm rest experience system executing at the processor in an embodiment may associate the gaming action event with a haptic command identifying a duration, intensity, and location of a haptic region within the combination haptic keyboard and palm rest assembly for haptic movement at block 812. The 3D haptic keyboard and palm rest experience system in an embodiment may associate the identified gaming action event (or its location in some embodiments) with a specific intensity or pulse pattern of the haptic response. For example, gaming action events that incorporate the player avatar (e.g., the player avatar firing a weapon or taking damage) may be associated with a greater intensity of haptic response tha gaming action events not involving the player avatar (e.g., enemy avatar taking damage, ally avatar firing on enemy avatar, or ally avatar taking damage). As another example, the firing of different weapons by the player avatar may be associated with different haptic response pulse patterns (e.g., rapid vibration vs. slower vibration).

At block 814, the 3D haptic keyboard and palm rest experience system executing at the processor may transmit the haptic command to the keyboard microcontroller or other controllers that may be implemented for invoking haptic responses in the combination haptic keyboard and palm rest assembly. For example, in an embodiment described with reference to FIG. 1, the 3D haptic keyboard and palm rest experience system may be operably connected to the keyboard controller 130. The 3D haptic keyboard and palm rest experience system in such an embodiment may transmit a haptic command identifying a haptic region (e.g., including one or more keys, the palm rest, or portions thereof) in which to initiate a haptic response. The haptic command in such an embodiment may further identify an intensity and pulse pattern in which to apply the haptic response. The intensity in an embodiment may take the form of a specific electrical charge value (e.g., voltage magnitude), or a percentage of the highest voltage that can be applied to piezoelectric actuators within a given haptic region. The pulse pattern in an embodiment may be identified by selection from a preset list of available waveforms of step functions pre-programmed into the keyboard controller 130 or other controllers, for example that relate to various types of haptic responses to a user.

The keyboard microcontroller in an embodiment may transmit an instruction to the keyboard main printed circuit board to initiate haptic movement at the identified haptic region of the combination haptic keyboard and palm rest assembly, based on the received haptic command at block 816. In some embodiments, this step may involve an instruction to apply the identified voltage magnitude according to the identified wave form or step function described directly above to a piezoelectric actuator operably connected directly to the keyboard main printed circuit board assembly. In other embodiments, this step may involve an instruction to command another printed circuit board operably connected to the keyboard main printed circuit board to apply the identified voltage magnitude according to the identified wave form or step function to a piezoelectric actuator operably connected thereto. In such a way, the 3D haptic keyboard and palm rest experience system in an embodiment may detect gaming action events associated with haptic responses as they occur during live gameplay, and instruct a keyboard controller to initiate a haptic response indicative of the gaming action event at a piezoelectric actuator whose location with respect to the user reflects the location of the gaming action event with respect to the player's avatar. The method of generating haptic commands based on gaming action events identified by measured changes in pixel brightness may then end.

FIG. 9 is a flow diagram illustrating a method of generating haptic movement at a portion of a combination keyboard and palm rest assembly, pursuant to a haptic command of the 3D haptic keyboard and palm rest experience system according to an embodiment of the present disclosure. As described herein, the three-dimensional (3D) haptic keyboard and palm rest experience system in an embodiment may provide haptic movement feedback at a haptic region of a combination keyboard and palm rest assembly correlating to the position of a gaming action event within a virtual three-dimensional gaming environment. The haptic movement feedback commands may be programmed into gaming application code, generated via a gaming image recognition model as described in FIG. 7, generated via pixel brightness detection system as described in FIG. 8, or other systems for identifying gaming action events, or combinations of such techniques in embodiments herein.

At block 902, the keyboard controller of an information handling system may receive a haptic command from a processor indicating a gameplay gaming action event has occurred in an identified location of a virtual three-dimensional gaming environment, and identifying a correlated haptic region of a combination haptic keyboard and palm rest assembly. For example, in various embodiments described herein, the 3D haptic keyboard and palm rest experience system may transmit instructions to a keyboard main printed circuit board and via a keyboard microcontroller to initiate a haptic response at one or more piezoelectric actuators. The locations of these one or more piezoelectric actuators with respect to the user in such embodiments may reflect the location of a gaming action event identified by the 3D haptic keyboard and palm rest experience system (e.g., from gaming application coded instructions, by a trained image recognition model, or through analysis of changes in pixel brightness) with respect to the player's avatar. The haptic command thus transmitted to the keyboard controller may identify a haptic region of the combination haptic keyboard and palm rest assembly, as well as an intensity, duration, or pulse pattern of the haptic response required. For example, the intensity may be described by a voltage magnitude or by a percentage of the maximum voltage that may be applied to a given piezoelectric actuator. The pulse pattern may be identified in an embodiment by a particular wave form or step function pre-programmed into the keyboard controller, for example. Several examples of rendering haptic feedback location and type on the combination haptic keyboard and palm rest assembly relative to 3D gaming action events may be applied.

The keyboard controller in an embodiment may determine at block 904 whether the haptic command identifies a haptic region within the palm rest or keyboard assembly. Electrical charges may be applied to piezoelectric actuators situated within the keyboard assembly via the keyboard main printed circuit board in an embodiment to cause haptic feedback at those piezoelectric actuators. In contrast, electrical charges may be applied to piezoelectric actuator situated within the palm rest assembly via a palm rest printed circuit board in an embodiment to cause haptic feedback within the palm rest. Thus, the keyboard controller must route the electrical charge generated based on the haptic command to a specific printed circuit board, based on the haptic region identified therewithin. If the haptic command identifies a haptic region within the palm rest assembly, the method may proceed to block 906 for initiation of a haptic movement within the palm rest assembly. If the haptic command identifies a haptic region within the keyboard assembly, the method may proceed to block 912 for initiation of a haptic movement within the keyboard assembly.

At block 906, in an embodiment in which the haptic command identifies a haptic region within the palm rest assembly, the keyboard controller may identify one or more palm rest haptic feedback regions associated with the haptic command, which may correlate to the location of the gameplay gaming action event within the virtual three-dimensional gaming environment or movement of gameplay action events across displayed gaming images. As described herein, the haptic command transmitted to the keyboard controller by the 3D haptic keyboard and palm rest experience system in an embodiment may associate an identified gaming action event occurring within live gameplay with a haptic response, based on the type or location of the identified gaming action event. For example, a haptic command generated upon detection of an enemy avatar damage gaming action event (e.g., 522) may identify a piezoelectric actuator situated within the right-side region of the palm rest.

The keyboard main printed circuit board assembly may transmit an electrical charge to one or more piezoelectric actuators within the identified haptic region via the palm rest printed circuit board assembly at block 908. For example, in an embodiment described with respect to FIG. 4B, the palm rest printed circuit board assembly 460 may be operably connected to the keyboard main printed circuit board assembly 440 within a palm rest junction 470 with the keyboard. The keyboard main printed circuit board assembly 440 in an embodiment may be so operably connected to the palm rest printed circuit board assembly 460 such that an electrical charge or haptic instruction may be transmitted to the palm rest printed circuit board assembly 460 via the keyboard main printed circuit board assembly 440, pursuant to a haptic command received from the keyboard controller operably connected to the keyboard main printed circuit board assembly 440.

For example, the keyboard controller may determine a port address or specific wire of the keyboard main printed circuit board assembly 440 that is electrically coupled to one of the piezoelectric actuators assigned to the haptic region identified within the haptic command. The keyboard main printed circuit board assembly 440 may be electrically coupled to a pogo pin (e.g., 471) via the junction printed circuit board assembly 472. The pogo pin 471 may be electrically coupled to an address of the palm rest printed circuit board assembly 460 which is also electrically coupled to the identified piezoelectric actuator (e.g., 432) assigned to the haptic region identified within the haptic command. The keyboard controller may thus instruct the keyboard main printed circuit board assembly 440 to generate an electrical charge having a voltage, duration, and pulse pattern dictated by the haptic command through the electrically coupled junction printed circuit board assembly 472, pogo pin (e.g., 471), and palm rest printed circuit board assembly 460, to the piezoelectric actuator (e.g., 432) assigned to the haptic region identified within the haptic command. In other embodiments, invoking haptic feedback response from piezo electric actuators of haptic regions of the haptic keyboard and palm rest assembly may be rendered by any of a keyboard controller, designated palm rest controllers, or some combination.

At block 910, the palm rest printed circuit board assembly in an embodiment may apply a voltage across a piezo actuator within the identified haptic region of the palm rest to cause haptic movement at the top surface of the palm rest. For example, in an embodiment described with reference to FIG. 4A, upon receipt of the haptic command specifically identifying the left haptic region 451a of a left hand palm rest haptic zone 451 in an embodiment, the keyboard controller may transmit an electrical charge through a matrix circuit incorporated within the keyboard main printed circuit board assembly 440 to the palm rest printed circuit board assembly 460. The piezoelectric actuator 430 in such an embodiment may then receive the electrical charge from the palm rest printed circuit board assembly 460. Upon application of the electrical charge to the piezoelectric actuator 430, a ceramic disc within the piezoelectric actuator 430 may be mechanically stretched or compressed so as to create a tactile haptic movement 402 such as the piezoelectric actuator warping up or down and returning to its pre-deformed state in a vibrating, clicking, bumping, or other manner of mechanical movement. This may cause the haptic movement 402 of the palm rest top cover 450 at the left haptic region 451*a*, felt by the hand of the user laying atop or in close contact with the palm rest top cover 450. Other haptic regions (e.g., 451*b*) of plural palm rest haptic portions may be similarly actuated based on haptic feedback rendering commands of location or type of haptic feedback corresponding to gaming action events during ongoing gameplay. The method with respect to haptic commands to initiate haptic movement within the palm rest of the combined haptic keyboard and palm rest assembly may then end.

In an embodiment in which the haptic command identifies a haptic region within the keyboard assembly, the keyboard main printed circuit board assembly may identify the key assembly associated with the haptic command at block 912. The location of the haptic region in such an embodiment may correlate to the location and type of the gameplay gaming action event within the virtual three-dimensional gaming environment. For example, a haptic command generated upon detection of a player avatar attack gaming action event (e.g., 511 in FIG. 5) may identify a piezoelectric actuator incorporated within the key assembly for the "F" key the user depresses in order to instruct the player avatar to fire a weapon. As another example, a haptic command generated upon detection of an enemy avatar damage gaming action event (e.g., 522) may identify a piezoelectric actuator situated within the right-side region of the palm rest.

In yet another example, a haptic command generated upon determination of a rough orientation or location of a gaming action event with respect to the player avatar in an embodiment may identify a number of piezoelectric actuators grouped within a haptic region defined within the combination haptic keyboard and palm rest assembly. More specifically, the 3D haptic keyboard and palm rest experience system may associate keys relative to a top-left location of keys being actuated by a user on the combination haptic keyboard and palm rest assembly with gaming action events detected within the top-left quadrant segment of live gameplay within the virtual 3D gaming environment 500 whether by gaming application code command, image recognition, pixel brightness, or other methods. In such an embodiment, the haptic command generated upon detection of enemy attack gaming action event 531 within the top-left quadrant segment of the captured image of live gameplay depicted at FIG. 5 may identify a plurality of piezoelectric actuators situated within key assemblies located within a haptic region defined to include the top-left set of keys relative to a user's hand (e.g., keys being actuated by a user during gameplay) on the combination haptic keyboard and palm rest assembly. In such a way, the 3D haptic keyboard and palm rest experience system in an embodiment may correlate the location of a haptic response with respect to the user of the combination haptic keyboard and palm rest assembly to the location of a gaming action event (e.g., 531) occurring with respect to the player avatar (e.g., 510) in the virtual three-dimensional gaming environment (e.g., 500).

At block 914, the keyboard main printed circuit board assembly in an embodiment may apply a voltage across the key cap piezo actuator within the identified key assembly to cause haptic movement at the key cap. For example, in an embodiment in which the key assembly includes a mechanical switch, as described with reference to FIG. 2, upon receipt of the haptic command specifically identifying the key assembly 200 in an embodiment, the keyboard controller may transmit an electrical charge through a matrix circuit incorporated within the keyboard main printed circuit board assembly 240 to the flexible printed circuit board 242. The flexible printed circuit board 242 in an embodiment may then deliver this electrical charge to the piezoelectric actuator 230 via contact 241. Upon application of the electrical charge to the piezoelectric actuator 230 by the keyboard controller, a ceramic disc within the piezoelectric actuator 230 may be mechanically stretched or compressed so as to create a tactile haptic movement event such as the piezoelectric actuator warping up or down and returning to its pre-deformed state in a vibrating manner. This may cause the haptic movement 202 of the key cap 210, felt by the fingertip or hand of the user.

As another example, in an embodiment incorporating a dome-type key assembly described with reference to FIG. 3, upon receipt of the haptic command specifically identifying the key assembly 300 in an embodiment, the keyboard controller may transmit an electrical charge through a matrix circuit incorporated within the keyboard main printed circuit board assembly 340 to the piezoelectric actuator 330 via contacts 344 and 345. Upon application of the electrical charge to the piezoelectric actuator 330 by the keyboard controller, a ceramic disc within the piezoelectric actuator 330 may be mechanically stretched or compressed so as to create a tactile haptic movement event such as the piezoelectric actuator warping up or down and returning to its pre-deformed state in a vibrating manner. This may cause the haptic movement 302 of the key cap 310, felt by the fingertip or hand of the user. The method may then end.

The blocks of the flow diagrams of FIGS. 7, 8 and 9 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A three-dimensional (3D) haptic keyboard and palm rest experience system for an information handling system, comprising:
    a display device to display an avatar image located within a virtual 3D gaming environment viewable by a user, as generated by a gaming application executing at a processor, and controlled pursuant to user input instructions received via an input device;
    the processor to determine a gaming action event involving the avatar image is displayed via the display device, and a position of the gaming action event, relative to the avatar within the virtual 3D gaming environment, wherein a measured magnitude and speed of change in pixel brightness for an identified region of pixels of the display device is received to determine the gaming action event involving the avatar image and a movement of the gaming action event within the virtual 3D gaming environment based on the measured magnitude and speed of change in pixel brightness and the identified region of pixels;
    a palm rest top cover having a first side and a second side corresponding to a right side and a left side of the palm rest, where the first side has a first plurality of piezoelectric actuators disposed thereunder and the second side has a second plurality of piezoelectric actuators disposed thereunder;
    a keyboard controller to identify a first portion of the first side of the palm rest top cover forming a first side palm rest top cover haptic region, where the first portion of the first side palm rest top cover haptic region has a location with respect to a user that correlates to the position of the gaming action event displayed within the virtual 3D gaming environment; and
    the keyboard controller to apply a change in voltage across the piezoelectric actuator disposed beneath the identified first portion of the first side palm rest top cover haptic region, to cause haptic movement in the first portion of the first side palm rest top cover haptic region correlated to the position of the gaming action event displayed within the virtual 3D gaming environment.

2. The information handling system of claim 1, wherein the avatar image represents the user, and the gaming action event is the avatar image taking damage.

3. The information handling system of claim 1, wherein the avatar image represents a non-user game character, and the gaming action event is the avatar image firing a weapon due to user game action input to a keyboard or to an input/output device.

4. The information handling system of claim 1, further comprising:
    the keyboard controller to identify a second portion of the first side palm rest top cover haptic region having the first plurality of piezoelectric actuators disposed thereunder, where the second portion of the first side palm rest top cover haptic region has a second location with respect to a user that correlates to a second position of a second gaming action event displayed within the virtual 3D gaming environment.

5. The information handling system of claim 1 further comprising:
    the processor training an image recognition model to identify the avatar image within a plurality of captured training gameplay images displaying the avatar image from a plurality of angles and a plurality of locations of varying depth from the perspective of the user.

6. The information handling system of claim 1 further comprising:
    the processor executing code instructions of a trained image recognition model to identify the gaming action event involving the avatar image and a movement of the gaming action event within the virtual 3D gaming environment within a captured image of live gameplay as displayed via the display device; and
    generating a moving haptic response across a plurality of piezoelectric actuators situated under a palm rest top cover, corresponding to the movement of the gaming action event.

7. The information handling system of claim 1 further comprising:
    the processor receiving from firmware for the display device the measured magnitude and speed of change in pixel brightness for the identified region of pixels of the display device; and
    the keyboard controller applying repeated change in voltage across the piezoelectric actuator disposed beneath the identified palm rest top cover haptic region, to cause pulses of graduating intensity of haptic movement in the palm rest top cover haptic region, correlated to the movement of the gaming action event.

8. A three-dimensional (3D) haptic keyboard and palm rest experience system for an information handling system, comprising:
    a display device to display a user avatar image and a non-user avatar image within a virtual 3D gaming environment viewable by a user and generated by a gaming application executing at a processor;
    the processor to determine a gaming action event is displayed via the display device, and a position of the gaming action event within the virtual 3D gaming environment, relative to the user avatar image, the gaming action event executed by or acting upon the user avatar image;
    a keyboard controller to identify a key cap of a keyboard having a location with respect to a user that correlates to the position of the gaming action event displayed within the virtual 3D gaming environment, relative to the user avatar image; and
    the keyboard controller to apply a change in voltage, via a flexible printed circuit board assembly, across a piezoelectric actuator disposed beneath the identified key cap for haptic actuation of that key cap that moves with the key cap, to cause haptic movement in the identified key cap correlated to the position of the gaming action event displayed within the virtual 3D gaming environment.

9. The information handling system of claim 8 further comprising:
    a mechanical keyboard switch assembly disposed beneath the piezoelectric actuator and the key cap.

10. The information handling system of claim 8 further comprising:
a keyboard dome plunger assembly disposed between the piezoelectric actuator and the key cap.

11. The information handling system of claim 8 further comprising:
the processor executing code instructions of a trained image recognition model to identify the gaming action event involving the avatar image and a movement of the gaming action event within the virtual 3D gaming environment within a captured image of live gameplay as displayed via the display device; and
generating a moving haptic response across a plurality of piezoelectric actuators, each situated beneath one of a plurality of key caps, corresponding to the movement of the gaming action event.

12. The information handling system of claim 8 further comprising:
the keyboard controller applying the change in voltage across the piezoelectric actuator disposed beneath the key cap to cause haptic movement of variable intensity in the key cap, based on an identification of an avatar image upon which the gaming action event is executed as the user avatar image or a non-user avatar image.

13. The information handling system of claim 8, wherein the gaming action event is the user avatar image firing a weapon.

14. The information handling system of claim 8, wherein the gaming action event is the non-user avatar image, located at a relative position with respect to the user avatar image within the 3D game environment, executing a gaming action event with respect to the user avatar image, and the location of the key cap with respect to the user correlates to the relative position of the non-user avatar image with respect to the user avatar image.

15. A method of causing haptic movement correlating to gameplay within a three-dimensional (3D) gaming environment, comprising:
capturing a plurality of training gameplay images displaying an avatar image located within a virtual 3D gaming environment generated by a gaming application executing at a processor and displayed via a display device;
training an image recognition model to identify the avatar image, a gaming action event involving the avatar image, and a position of the gaming action event within the captured plurality of training gameplay images, to establish corresponding haptic commands for the gaming action event, wherein training the image recognition model to identify the avatar image uses a feed-forward neural network with back-propagation error correction until the image recognition model accurately identifies the avatar image in a preset threshold percentage of the captured plurality of training gameplay images;
capturing a live gameplay image displaying the avatar image and the gaming action event involving the avatar image;
inputting the live gameplay image into the image recognition model to output a haptic command corresponding to the identified avatar image, the gaming action event involving the avatar image, and the position of the gaming action event within the live gameplay image;
identifying a first portion of a first side of a palm rest top cover forming a first side haptic palm rest region of a combination keyboard and palm rest assembly having a location with respect to a user that correlates to the position of the gaming action event of the avatar image identified by the image recognition model, where the palm rest top cover has the first side with a first array of piezoelectric actuators disposed thereunder and a second side with a second array of piezoelectric actuators disposed thereunder;
applying a change in voltage, in response to the haptic command, across a piezoelectric actuator in the first array of piezoelectric actuators disposed beneath the first portion of the first side haptic region of the combination keyboard and palm rest assembly, to cause haptic movement in the first portion of the first side haptic region of the combination keyboard and palm rest assembly correlated to the position of the gaming action event displayed within the virtual 3D gaming environment.

16. The method of claim 15, wherein the haptic region of the combination keyboard and palm rest assembly further includes a key in the keyboard with a piezo electric actuator of the first array of piezoelectric actuators on the first side haptic region.

17. The method of claim 15, wherein the first side haptic region of the combination keyboard and palm rest assembly includes the first side haptic region of the palm rest and a plurality of keys on a keyboard above the first side of the palm rest.

18. The method of claim 15 further comprising:
training the image recognition model to identify the gaming action event involving the avatar image and a movement of the gaming action event within the virtual 3D gaming environment based on the measured magnitude and speed of change in pixel brightness and identified region of pixels in training gameplay images.

19. The method of claim 15, further comprising:
identifying a second portion of the second side of the palm rest top cover forming a second side haptic palm rest region of the combination keyboard and palm rest assembly having a second location with respect to a user that correlates to a second position of a second gaming action event of the avatar image identified by the image recognition model to actuate a second piezoelectric actuator in the second array of piezoelectric actuators.

20. The method of claim 15, further comprising:
identifying a second portion of the first side of the palm rest top cover forming the first side haptic palm rest region of the combination keyboard and palm rest assembly having a second location with respect to the user that correlates to a second position of a second gaming action event of the avatar image identified by the image recognition model to actuate a second piezoelectric actuator in the first array of piezoelectric actuators.

* * * * *